(12) United States Patent
Kinoshita et al.

(10) Patent No.: US 11,139,376 B2
(45) Date of Patent: Oct. 5, 2021

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Akimasa Kinoshita, Matsumoto (JP); Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/549,550

(22) Filed: Aug. 23, 2019

(65) Prior Publication Data
US 2020/0119147 A1 Apr. 16, 2020

(30) Foreign Application Priority Data
Oct. 16, 2018 (JP) .............................. JP2018-195460

(51) Int. Cl.
| | | |
|---|---|---|
| *H01L 21/02* | (2006.01) | |
| *H01L 29/16* | (2006.01) | |
| *H01L 29/66* | (2006.01) | |
| *H01L 29/78* | (2006.01) | |
| *H01L 29/423* | (2006.01) | |

(52) U.S. Cl.
CPC .... *H01L 29/1608* (2013.01); *H01L 21/02529* (2013.01); *H01L 29/4236* (2013.01)

(58) Field of Classification Search
CPC ... H01L 21/02; H01L 21/02529; H01L 29/06; H01L 29/0623; H01L 29/08; H01L 29/0878; H01L 29/16; H01L 29/1608; H01L 29/42; H01L 29/4236; H01L 29/66; H01L 29/66068; H01L 29/78; H01L 29/7813; H01L 29/1095
USPC ........................................................ 257/77
See application file for complete search history.

(56) References Cited

U.S. PATENT DOCUMENTS

| | | | |
|---|---|---|---|
| 2018/0033876 A1 | 2/2018 | Sugahara et al. | |
| 2018/0033885 A1* | 2/2018 | Okumura | .......... H01L 21/02529 |
| 2019/0214457 A1* | 7/2019 | Kinoshita | ............. H01L 21/046 |

FOREIGN PATENT DOCUMENTS

JP 2018-19046 A 2/2018

* cited by examiner

Primary Examiner — Fazli Erdem

(57) ABSTRACT

A trench gate MOSFET has at an n-type current spreading region between an $n^-$-type drift region and a p-type base region, a first $p^+$-type region facing a bottom of a trench, and a second $p^+$-type region disposed between adjacent trenches. The first and the second $p^+$-type regions extend parallel to a first direction in which the trench extends and are partially connected by a $p^+$-type connecting portion and thus, disposed in a ladder shape when viewed from the front surface of a semiconductor substrate. The second $p^+$-type region has at a portion of a surface on a drain side, a recessed portion that is recessed toward a source side. One or more recessed portions is provided between connection sites in the second $p^+$-type region for connection with the $p^+$-type connecting portions that are adjacent to each other in the first direction X.

9 Claims, 15 Drawing Sheets

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-195460, filed on Oct. 16, 2018, the entire contents of which are incorporated herein by reference.

BACKGROUND

1. Field

Embodiments of the invention relate to a silicon carbide semiconductor device and a method of manufacturing a silicon carbide semiconductor device.

2. Description of the Related Art

Compared to conventional semiconductor elements that use silicon, semiconductor devices (hereinafter, silicon carbide semiconductor devices) that use silicon carbide (SiC) as a semiconductor material have advantages such as enabling reduction of the resistance of the device in an ON state to several hundredths of that of a conventional semiconductor element and use in environments of higher temperatures (200 degrees C. or higher). This is due to characteristics of the material itself including silicon carbide having a bandgap that is about 3 times larger than that of silicon and a dielectric breakdown field strength that is nearly 10 times higher than that of silicon.

Further, when elements of a same ON resistance (Ron) are compared, a trench gate structure enables an element area (chip area) to be made significantly smaller than a planar gate structure in which a MOS gate (an insulated gate including a metal—an oxide film—a semiconductor material) is provided in a plate-like shape on a semiconductor substrate and may be said to be a promising future device structure. A trench gate structure is a three-dimensional structure in which a MOS gate is embedded in a trench formed in a semiconductor substrate containing silicon carbide and a portion along a trench side wall is used as a channel (inversion layer).

As a conventional silicon carbide semiconductor device having a trench gate structure, a device has been proposed in which an n-type impurity concentration of an n-type current spreading region is higher at a portion directly beneath a second $p^+$-type region between (mesa region) adjacent trenches than at a portion directly beneath a first $p^+$-type region facing a bottom of a trench in a thickness direction Z (for example, refer to Japanese Laid-Open Patent Publication No. 2018-019046). In Japanese Laid-Open Patent Publication No. 2018-019046, by n-type impurity concentration distribution of this n-type current spreading region, breakdown voltage (withstand voltage) of a trench bottom is higher than breakdown voltage near a center of the mesa region and an occurrence of avalanche breakdown at the trench bottom is suppressed.

A structure of the conventional silicon carbide semiconductor device having a trench gate structure will be described. FIG. 21 is a cross-sectional view of the structure of the conventional silicon carbide semiconductor device. FIG. 21 is FIG. 1 of Japanese Laid-Open Patent Publication No. 2018-019046. FIG. 22 is a perspective view of FIG. 21. In FIG. 22, while a configuration in an n-type current spreading region 103 between (mesa region) trenches 107 is depicted with an interlayer insulating film 111 being transparent in only in a mesa region furthest on the right-hand side, configuration of the mesa region is the same in all mesa regions. Further, in FIG. 22, a metal film 112$b$ that configures a source electrode 112 is not depicted.

The conventional silicon carbide semiconductor device depicted in FIGS. 21 and 22 is a vertical metal oxide semiconductor field effect transistor (MOSFET: a MOS-type field effect transistor including an insulated gate formed by a three-layer structure of a metal—an oxide film—a semiconductor) that uses a semiconductor substrate (semiconductor chip) 110 containing silicon carbide. A MOS gate is configured by a p-type base region 104, an $n^+$-type source region 105, a $p^{++}$-type contact region 106, a trench 107, a gate insulating film 108, and a gate electrode 109.

The n-type current spreading region 103 that is a so-called current spreading layer (CSL) and that reduces spreading resistance is provided between an $n^-$-type drift region 102 and the p-type base region 104. First and second $p^+$-type regions 121, 122 are provided in the n-type current spreading region 103. The first $p^+$-type region 121 opposes a bottom of the trench 107 in the thickness direction (vertical direction). Between (mesa region) adjacent trenches 107, the second $p^+$-type region 122 is provided separated from the first $p^+$-type region 121 and is partially connected to the first $p^+$-type region 121 by a $p^+$-type region 123.

Further, in the n-type current spreading region 103, an $n^+$-type region 124 is provided directly beneath (side toward an $n^+$-type drain region 101) the second $p^+$-type region 122. Due to the $n^+$-type region 124, the n-type impurity concentration of the n-type current spreading region 103 is higher at a portion 132 directly beneath the second $p^+$-type region 122 than at a portion 131 directly beneath the first $p^+$-type region 121. Reference numerals 101 and 113 are the $n^+$-type drain region and a drain electrode, respectively. Reference numerals 112$a$ and 112$b$ are metal films that are sequentially stacked on the semiconductor substrate 110 and that configure the source electrode 112.

SUMMARY

According to an embodiment of the present invention a silicon carbide semiconductor device includes a semiconductor substrate containing silicon carbide; a first semiconductor layer configuring a rear surface of the semiconductor substrate; a second semiconductor layer of a first conductivity type and configuring the semiconductor substrate, the second semiconductor layer disposed in contact with the first semiconductor layer, closer to a front side of the semiconductor substrate than is the first semiconductor layer; a third semiconductor layer of a second conductivity type and configuring a front surface of the semiconductor substrate, the third semiconductor layer being a portion of the semiconductor substrate other than the first semiconductor layer and the second semiconductor layer; a first semiconductor region of the first conductivity type and selectively provided in the third semiconductor layer; a second semiconductor region of the second conductivity type, the second semiconductor region being a portion of the third semiconductor layer other than the first semiconductor region; a trench that penetrates the first semiconductor region and the second semiconductor region, and reaches the second semiconductor layer, the trench extending in a linear shape in a first direction parallel to the front surface of the semiconductor substrate; a gate electrode provided in the trench via a gate insulating film; a first second-conductivity-type region extending in a linear shape in the first direction and selectively provided in the second semiconductor layer, the first second-conductivity-type region facing a bottom of the trench in a thickness direction and separated from the second semiconductor region; a second second-conductivity-type region extending in a linear shape in the first direction and provided in the second semiconductor layer, the second second-conductivity-type region being separated from the trench and the first second-conductivity-type region, and in contact with the second semiconductor region; a plurality of third second-conductivity-type regions provided in the second semiconductor layer, between the first second-conductivity-type region and the second second-conductivity-type region, the plurality of third second-conductivity-type regions being interspersed at a predetermined interval in the first direction and partially connecting the first second-conductivity-type region and the second second-conductivity-type region; a first electrode disposed at the front surface of the semiconductor substrate and electrically connected to the first semiconductor region and the second semiconductor region; and a second electrode provided at the rear surface of the semiconductor substrate and electrically connected to the first semiconductor layer. The second second-conductivity-type region has at a portion of a surface on side thereof facing toward the second electrode, one or more recessed portions recessed toward the first electrode. The one or more recessed portions is provided between connection sites between the second second-conductivity-type region and the plurality of third second-conductivity-type regions that are adjacent in the first direction.

In the embodiment, an equal number of the one or more recessed portions is provided between all the connection sites between the second second-conductivity-type region and the plurality of third second-conductivity-type regions that are adjacent in the first direction.

In the embodiment, the one or more recessed portions is provided at equal intervals between the connection sites between the second second-conductivity-type region and the plurality of third second-conductivity-type regions that are adjacent in the first direction.

In the embodiment, the one or more recessed portions is provided separated from the connection sites between the second second-conductivity-type region and the plurality of third second-conductivity-type regions, in the first direction.

In the embodiment, the one or more recessed portions is provided separated from the connection sites between the second second-conductivity-type region and the plurality of third second-conductivity-type regions by at least 0.25 µm in the first direction.

In the embodiment, all the one or more recessed portions has a same width in the first direction.

In the embodiment, the silicon carbide semiconductor device further includes a third semiconductor region of the first conductivity type in a surface layer on a side of the second semiconductor layer forming an interface with the third semiconductor layer, the third semiconductor region having an impurity concentration that is higher than an impurity concentration of the second semiconductor layer. The bottom of the trench terminates in the third semiconductor region. The first second-conductivity-type region, the second second-conductivity-type region, and the third second-conductivity-type region are selectively provided in the third semiconductor region.

According to another embodiment, a method of manufacturing a silicon carbide semiconductor device includes depositing a second semiconductor layer containing silicon carbide on a surface of a first semiconductor layer containing silicon carbide; forming on a surface of the second semiconductor layer, a first ion implantation mask having a first opening corresponding to a formation region of a first second-conductivity-type region, a second opening corresponding to a formation region of a second second-conductivity-type region, and a third opening corresponding to a formation region of a third second-conductivity-type region; selectively forming the first second-conductivity-type region, a fourth second-conductivity-type region, and the third second-conductivity-type region in a surface layer of the second semiconductor layer by ion implanting a second conductivity-type impurity using the first ion implantation mask; removing the first ion implantation mask after selectively forming the first second-conductivity-type region, the fourth second-conductivity-type region, and the third second-conductivity-type region; increasing a thickness of the second semiconductor layer by depositing a first-conductivity-type semiconductor layer on a surface of the second semiconductor layer after removing the first ion implantation mask; forming at the surface of the second semiconductor layer after increasing the thickness of the second semiconductor layer, a second ion implantation mask having a fourth opening corresponding to a formation region of the second second-conductivity-type region; ion implanting a second-conductivity-type impurity using the second ion implantation mask and thereby selectively forming in a portion that increases the thickness of the second semiconductor layer, a fifth second-conductivity-type region at a depth reaching the fourth second-conductivity-type region and forming the second second-conductivity-type region by connecting in a thickness direction, the fourth second-conductivity-type region and the fifth second-conductivity-type region; removing the second ion implantation mask after forming the second second-conductivity-type region; depositing on the surface of the second semiconductor layer after removing the second ion implantation mask, a third semiconductor layer containing silicon carbide and thereby fabricating a semiconductor substrate having the first semiconductor layer, the second semiconductor layer, and the third semiconductor layer, a rear surface configured by the first semiconductor layer and a front surface configured by the third semiconductor layer; selectively forming in the third semiconductor layer, a first semiconductor region of a first conductivity type, a portion of the third semiconductor layer excluding the first semiconductor region being a second semiconductor region of a second conductivity type; forming separated from the second second-conductivity-type region, a trench that penetrates the first semiconductor region and the second semiconductor region, and reaches the second semiconductor layer, a bottom facing the first second-conductivity-type region in a depth direction; forming a gate electrode in the trench via a gate insulating film; forming at the front surface of the semiconductor substrate, a first electrode electrically connected to the first semiconductor region and the second semiconductor region; and forming at the rear surface of the semiconductor substrate, a second electrode electrically connected to the first semiconductor layer. Forming the trench includes forming the trench to extend in a linear shape in a first direction parallel to the front surface of the semiconductor substrate. Forming the first ion implantation mask includes: forming the first ion implantation mask to have the first opening extending in a linear shape in the first direction, the second opening interspersed at a predetermined interval in the first direction at positions separated from the first opening, and the third opening connecting the first opening and the second opening and interspersed at a predetermined interval in the first direction between the first opening and the second opening; and forming the first ion implantation mask to have sandwiched between the second openings that are adjacent to each other in the first direction, one or more portions connected to a portion between the third openings that are adjacent each other in the first direction. Forming the second ion implantation mask includes forming the second ion implantation mask to have the fourth opening extending in a linear shape in the first direction and exposing the fourth second-conductivity-type region and a portion of the second semiconductor layer between the fourth second-conductivity-type regions that are adjacent.

In the embodiment, the first ion implantation mask has the second opening interspersed at an interval of 0.4 μm or more in the first direction.

In the embodiment, the first ion implantation mask has the second opening interspersed at an interval of 1.4 μm or less in the first direction.

Objects, features, and advantages of the present invention are specifically set forth in or will become apparent from the following detailed description of the invention when read in conjunction with the accompanying drawings.

DESCRIPTION OF EMBODIMENTS

Figure 21:
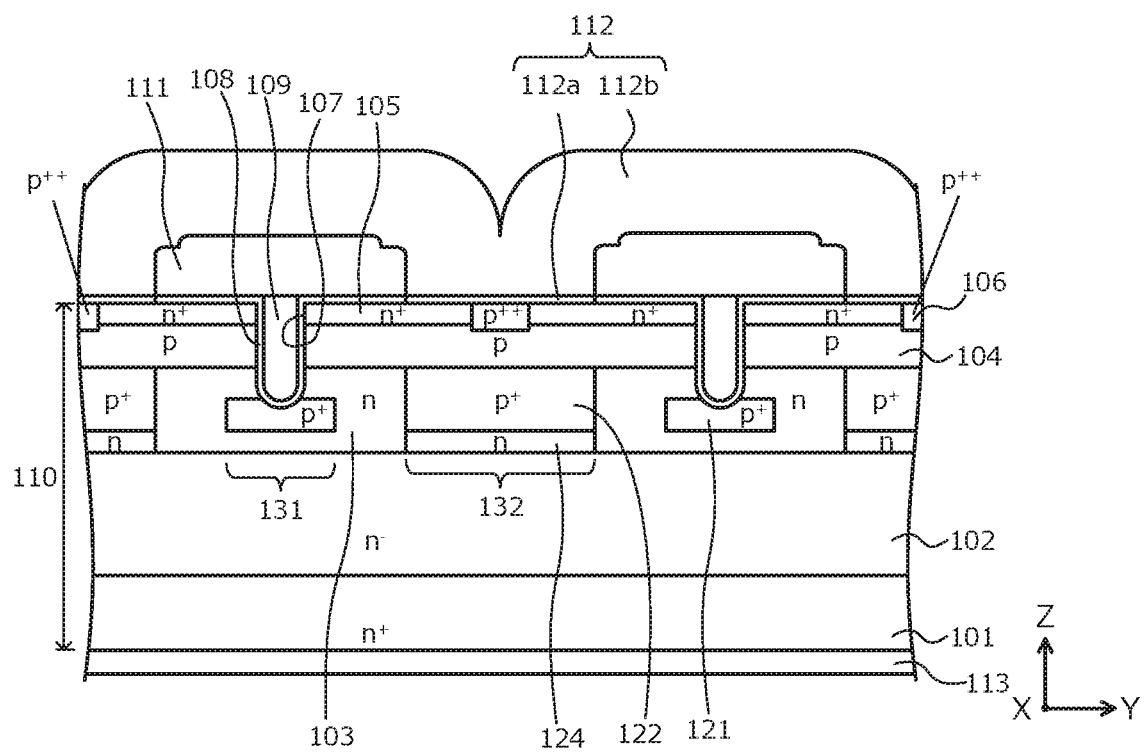
FIG. 21 is a cross-sectional view of a structure of a conventional silicon carbide semiconductor device.
Figure 22:
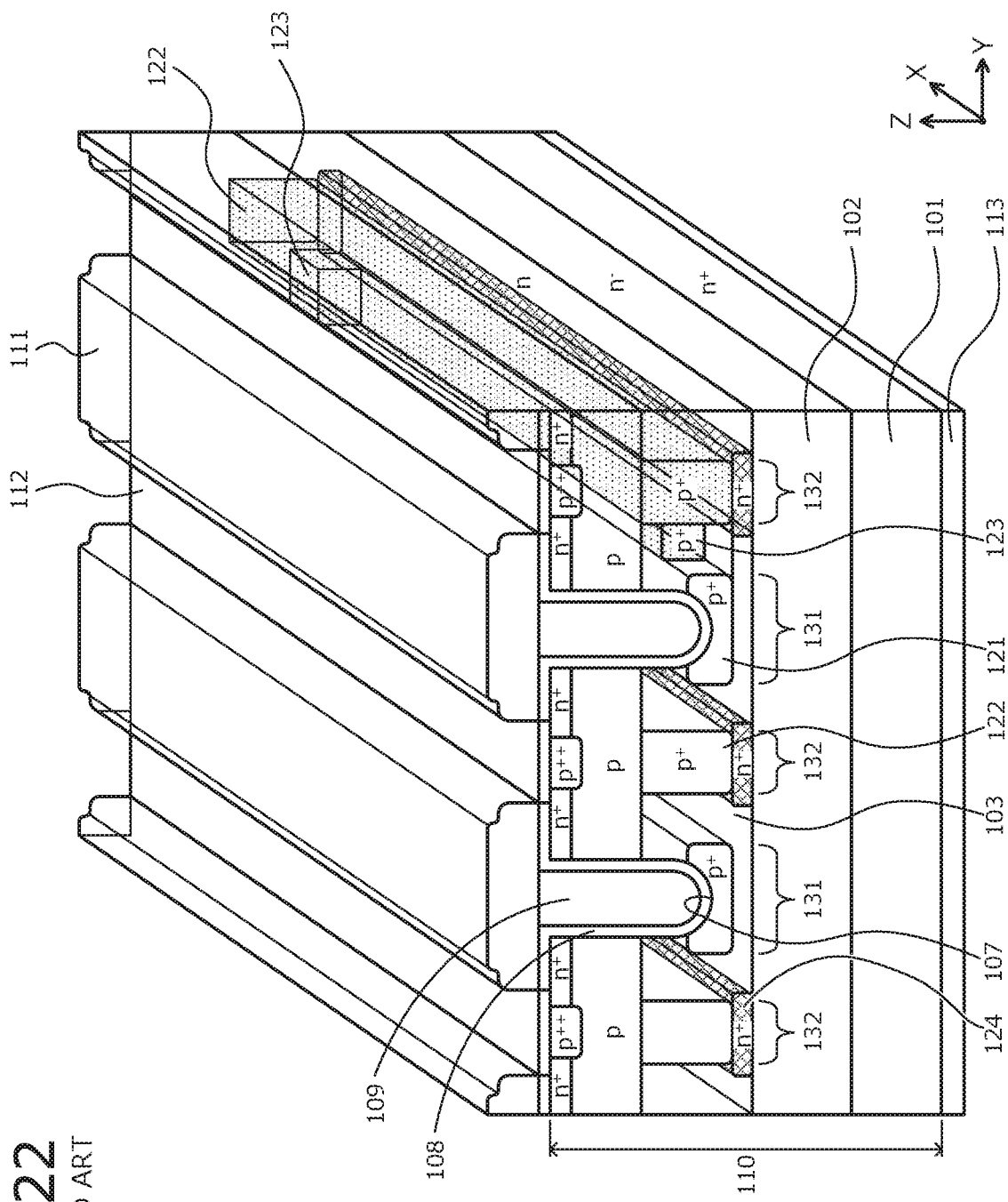
FIG. 22 is a perspective view of FIG. 21.

First, problems related to the conventional techniques will be discussed. In the described conventional silicon carbide semiconductor device having a trench gate structure (refer to FIGS. 21 and 22), the $n^+$-type region 124 that is a portion having a low breakdown voltage in the n-type current spreading region 103 is formed by ion implantation. Therefore, a manufacturing process becomes longer by the number of processes for selectively forming the $n^+$-type region 124 in the n-type current spreading region 103.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
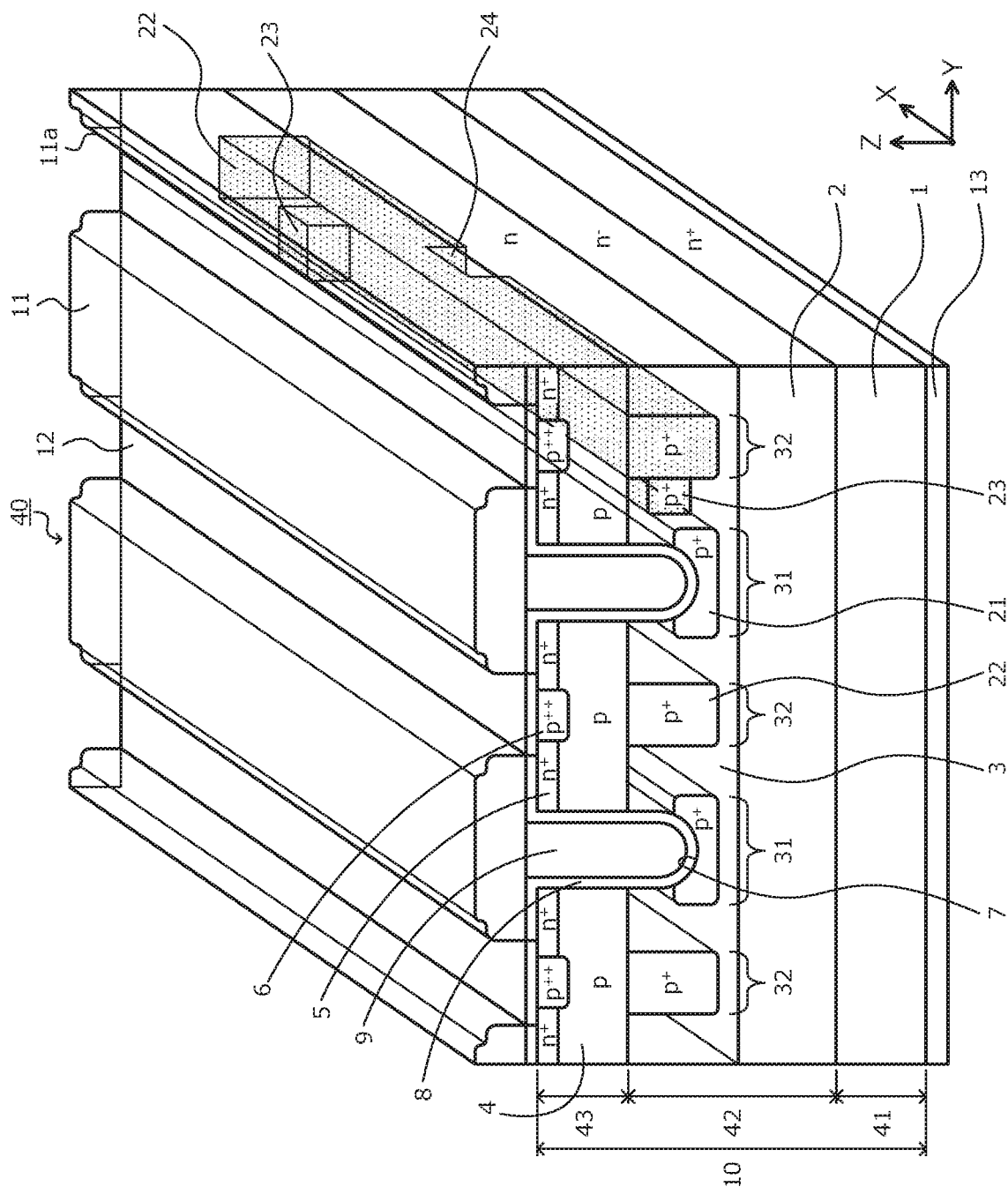
FIG. 1 is a perspective view of a structure of a silicon carbide semiconductor device according to an embodiment.
Figure 2:
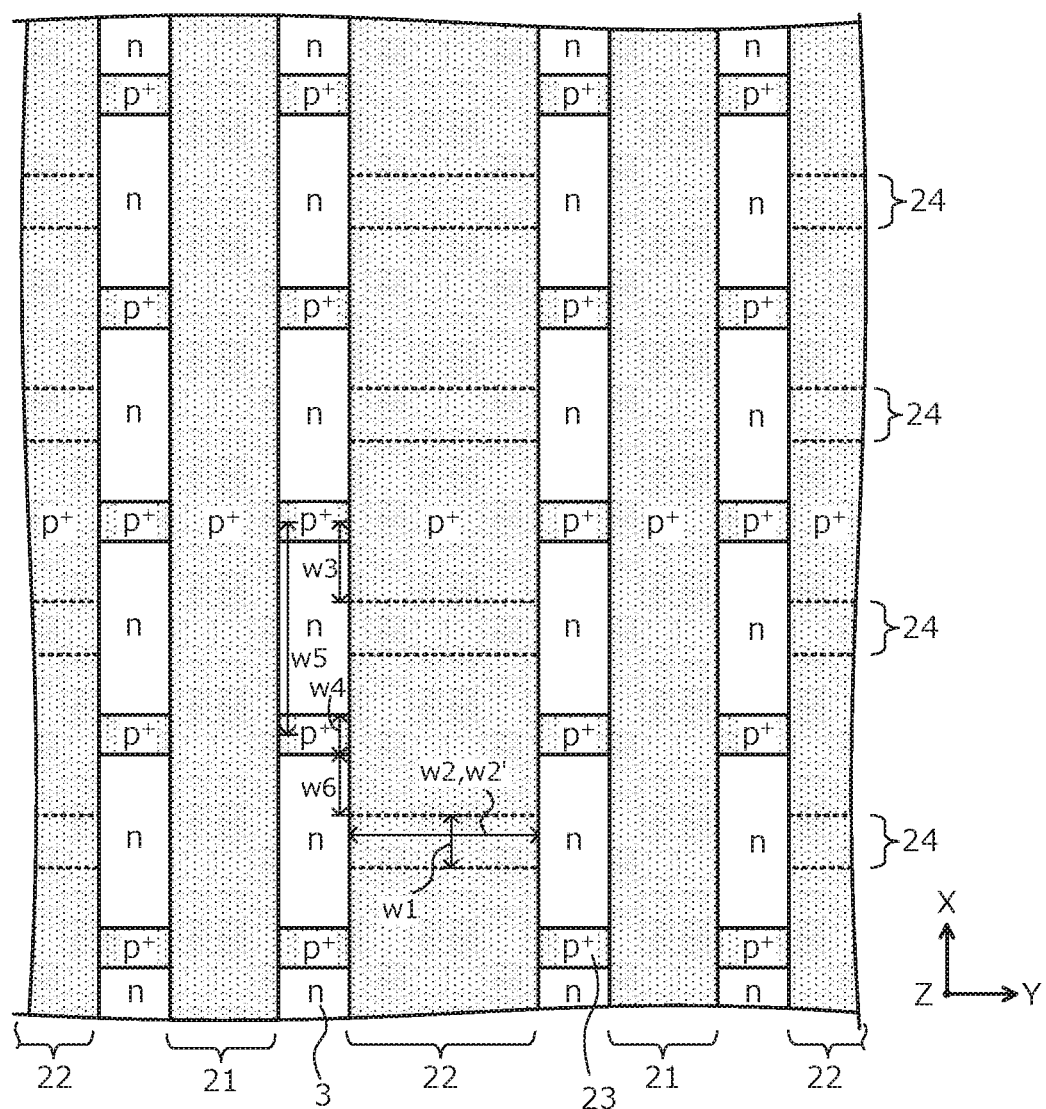
FIG. 2 is a plan view of a layout when a portion in FIG. 1 is viewed from a front side of a semiconductor substrate.

A structure of a silicon carbide semiconductor device according to an embodiment will be described. FIG. 1 is a perspective view of the structure of the silicon carbide semiconductor device according to the embodiment. In FIG. 1, a configuration in an n-type current spreading region 3 is depicted transparently. Further, in FIG. 1, while a configuration between (mesa region) adjacent trenches 7 is depicted in detail with an interlayer insulating film 11 being transparent in only a mesa region further on the right-hand side, configuration of the mesa region is the same in all mesa regions. FIG. 2 is a plan view of a layout when a portion in FIG. 1 is viewed from a front side of a semiconductor substrate. In FIG. 2, first and second $p^+$-type regions 21, 22 and a $p^+$-type connecting portion 23 are indicated by hatching and a recessed portion 24 of the second $p^+$-type region 22 is indicated by a dashed line.

A silicon carbide semiconductor device 40 according to the embodiment and depicted in FIG. 1 is a vertical MOSFET that includes at a front side of a semiconductor substrate (semiconductor chip) 10 containing silicon carbide (SiC), a MOS gate having a general trench gate structure and that in the n-type current spreading region 3, selectively has at a position separated from the MOS gate, a second portion 32 having a low breakdown voltage (withstand voltage). In FIG. 1, only an active region in which a main current flows when an element is in an ON state is depicted, and an edge termination region that surrounds a periphery of the active region is not depicted. The edge termination region has an edge termination structure that mitigates electric field at the front surface side of the semiconductor substrate 10 and sustains a breakdown voltage. The breakdown voltage is a voltage limit at which no errant operation of damage of an element occurs.

The MOS gate is configured by a p-type base region (second semiconductor region) 4, an $n^+$-type source region (first semiconductor region) 5, a $p^{++}$-type contact region 6, a trench 7, a gate insulating film 8, and a gate electrode 9. In particular, the semiconductor substrate 10, for example, is a silicon carbide epitaxial substrate in which at a front surface of an $n^+$-type starting substrate (first semiconductor layer) 41 containing silicon carbide, silicon carbide layers (second and third semiconductor layers) 42, 43 forming the $n^-$-type drift region 2 and the p-type base region 4 are sequentially formed by epitaxial growth. The $n^+$-type starting substrate 41 configures an $n^+$-type drain region 1. A main surface on a side of the semiconductor substrate 10 with the p-type silicon carbide layer 43 is set as a front surface while a main surface (rear surface of the $n^+$-type starting substrate 41) on a side with the $n^+$-type starting substrate 41 is set as a rear surface.

In the $n^-$-type silicon carbide layer 42, the n-type current spreading region (third semiconductor region) 3 is provided and is in contact with the p-type silicon carbide layer 43. The n-type current spreading region 3 is provided having a uniform thickness along a border between the $n^-$-type silicon carbide layer 42 and the p-type silicon carbide layer 43. The n-type current spreading region 3 is a so-called current spreading layer (CSL) that reduces spreading resistance. A portion of the $n^-$-type silicon carbide layer 42 excluding the n-type current spreading region 3 is the $n^-$-type drift region 2. In the n-type current spreading region 3, the first and the second $p^+$-type regions (first and second second-conductivity-type regions) 21, 22 are each selectively provided. Detailed description of the first and the second $p^+$-type regions 21, 22 is given hereinafter.

In the p-type silicon carbide layer 43, the $n^+$-type source region 5 and the $p^{++}$-type contact region 6 are each selectively provided. The $p^{++}$-type contact region 6 is disposed at a position separated farther from the gate electrode 9 in a direction parallel to the front surface of the semiconductor substrate 10, than is the $n^+$-type source region 5. A portion of the p-type silicon carbide layer 43 excluding the $n^+$-type source region 5 and the $p^{++}$-type contact region 6 is the p-type base region 4. The trench 7 penetrates the $n^+$-type source region 5 and the p-type base region 4, and reaches the n-type current spreading region 3. The trench 7 is provided in a striped shape extending along a direction (hereinafter, first direction) X parallel to the front surface of the semiconductor substrate 10.

In the trench 7, the gate electrode 9 is provided via the gate insulating film 8. A source electrode (first electrode) 12 is in contact with the $n^+$-type source region 5 and the $p^{++}$-type contact region 6, and is electrically insulated from the gate electrode 9 by the interlayer insulating film 11. The source electrode 12 may have a stacked structure formed by stacking plural metal films. In FIG. 1, of plural metal films configuring the source electrode 12, a metal film forming an ohmic contact with the $n^+$-type source region 5 and the $p^{++}$-type contact region 6 is depicted while metal films such as a barrier metal, a source pad, etc. are not depicted. At the rear surface of the semiconductor substrate 10, a drain electrode (second electrode) 13 is provided in contact with the $n^+$-type drain region 1.

The first and the second $p^+$-type regions 21, 22 will be described in detail with reference to FIG. 2. In FIG. 2, the first and the second $p^+$-type regions 21, 22 and a $p^+$-type connecting portion (third second-conductivity-type region) 23 described hereinafter are indicated by hatching. In the n-type current spreading region 3, the first and the second $p^+$-type regions 21, 22 are disposed in a striped shape parallel to the first direction X along which the trench 7 extends. Further, the first and the second $p^+$-type regions 21, 22 are disposed to repeatedly alternate each other along a direction (hereinafter, second direction) Y that is orthogonal to the first direction X and parallel to the front surface of the semiconductor substrate 10. The first and the second $p^+$-type regions 21, 22 have a function of mitigating electric field that is applied to the gate insulating film 8 when the MOSFET is OFF, by pn junctions between the first and the second $p^+$-type regions 21, 22 and the n-type current spreading region 3.

In particular, the first $p^+$-type region 21 opposes a bottom of the trench 7 in the thickness direction Z. The bottom of the trench 7 may terminate in the first $p^+$-type region 21. Further, the first $p^+$-type region 21 is provided separated from the p-type base region 4 and the $n^-$-type drift region 2. In other words, the first $p^+$-type region 21 is provided at a position deeper toward a drain (toward the $n^+$-type drain region 1) from the front surface of the semiconductor substrate 10 than is a border between the p-type base region 4 and the n-type current spreading region 3 and at a position shallower toward a source (toward the $n^+$-type source region 5) than is a border between the n-type current spreading region 3 and the $n^-$-type drift region 2.

In the mesa region, the second $p^+$-type region 22 is provided in contact with the p-type base region 4 and separated from the first $p^+$-type region 21 and the trench 7. The second $p^+$-type region 22 is provided separated from the $n^-$-type drift region 2. In other words, the second $p^+$-type region 22 is provided at a position shallower toward the source from the front surface of the semiconductor substrate 10 than is the border between the n-type current spreading region 3 and the $n^-$-type drift region 2. The second $p^+$-type region 22, for example, is provided substantially in a center of the mesa region and opposes the $p^{++}$-type contact region 6 across the p-type base region 4 in the thickness direction Z.

Further, the second $p^+$-type region 22 is electrically connected to the first $p^+$-type region 21 by the $p^+$-type region (hereinafter, $p^+$-type connecting portion) 23 selectively provided between the second $p^+$-type region 22 and the first $p^+$-type region 21 adjacent thereto across the n-type current spreading region 3. One pair of the first and the second $p^+$-type regions 21, 22 adjacent to each other and extending parallel to the first direction X and, for example, two or more of the $p^+$-type connecting portions 23 provided at a predetermined interval along the first direction X between this pair of the first and the second $p^+$-type regions 21, 22 are disposed in, for example, a ladder-like shape as viewed from the front surface of the semiconductor substrate 10.

The second $p^+$-type region 22 has the recessed portion 24 that is a portion of a surface on a side of the second $p^+$-type region 22 facing toward the drain, the portion being recessed toward the source to a non-penetrating predetermined depth along the thickness direction Z. In other words, the second p+-type region 22 is in a partially removed state in which at a first portion where the recessed portion 24 is provided, a thickness is thinner than a thickness at another second portion. The recessed portion 24 is provided in the second p+-type region 22, whereby breakdown voltage of the n-type current spreading region 3 is lower at the second portion 32 directly beneath the second p+-type region 22 than at a first portion 31 directly beneath the first p+-type region 21.

One or more of the recessed portions 24 of the second p+-type region 22 is provided between connection sites in the second p+-type region 22 for connection with the p+-type connecting portions 23 that are adjacent to each other in the first direction X. When three or more of the recessed portions 24 are disposed between the connection sites in the second p+-type region 22 for connection with the p+-type connecting portions 23 that are adjacent to each other in the first direction X, the recessed portions 24 may be disposed at equal intervals in the first direction X. The number of the recessed portions 24 disposed between the connection sites in the second p+-type region 22 for connection with the p+-type connecting portions 23 that are adjacent to each other in the first direction X is increased, whereby current concentration at one of the recessed portions 24 may be mitigated.

For example, at sites where current easily concentrates, as compared to other sites, the number of the recessed portions 24 disposed between the connection sites in the second p+-type region 22 for connection with the p+-type connecting portions 23 that are adjacent to each other in the first direction X is increased and the interval between the recessed portions 24 is reduced, whereby current concentration at the recessed portions 24 may be mitigated. A site where current easily concentrates is a portion opposing an electrode pad in a depth direction, a vicinity of a border between the active region and the edge termination region. A width w1 of the recessed portion 24 of the second p+-type region 22 in the first direction X may be the same for all of the recessed portions 24.

On the other hand, as the number of the recessed portions 24 disposed between the connection sites in the second p+-type region 22 for connection with the p+-type connecting portions 23 that are adjacent to each other in the first direction X increases, leak current Idss between the drain and the source increases. Therefore, in reducing the leak current Idss between the drain and the source, while it is favorable for the number of the recessed portions 24 disposed between the connection sites in the second p+-type region 22 for connection with the p+-type connecting portions 23 that are adjacent to each other in the first direction X to be fewer, even when the number of the recessed portions 24 is increased, the breakdown voltage does not substantially change and therefore, the number of the recessed portions 24 is increased, whereby the leak current Idss between the drain and the source may be distributed and reliability may be enhanced.

To lower the leak current Idss between the drain and the source to be equal to or less than in a conventional structure (refer to FIGS. 21 and 22), between the connection sites in the second p+-type region 22 for connection with the p+-type connecting portions 23 that are adjacent to each other in the first direction X, a percentage of a portion reduced by the recessed portion 24 of the second p+-type region 22 may be less than 50%. In particular, for example, when a first ion implantation mask 50 described hereinafter is left having a remaining width w11 of 1 μm in the first direction X, the number of the recessed portions 24 disposed between the connection sites in the second p+-type region 22 for connection with the p+-type connecting portions 23 adjacent thereto in the first direction X may be three.

Further, by reducing the width w1 of the recessed portion 24 of the second p+-type region 22 in the first direction X, the leak current Idss between the drain and the source may be reduced. The recessed portions 24 may be disposed in a same layout in all of the second p+-type regions 22. The recessed portions 24 of the second p+-type region 22 may be disposed separated from the p+-type connecting portion 23 in the first direction X. A distance w6 in the first direction X between the recessed portion 24 of the second p+-type region 22 and the p+-type connecting portion 23 may be, for example, 0.25 μm or more.

The width w1 of the recessed portion 24 of the second p+-type region 22 in the first direction X is a dimension obtained by subtracting substantially 0.4 μm from the remaining width w11 of the remaining first ion implantation mask 50 described hereinafter, the remaining width w11 in the first direction X. A width w2 of the recessed portion 24 of the second p+-type region 22 in the second direction Y is the same as a width w2' of the second p+-type region 22 in the second direction Y and, for example, is in a range from about 0.7 μm to 0.9 μm. A cross-sectional shape of the recessed portion 24 of the second p+-type region 22 may be substantially rectangular or elliptical, or may be trapezoidal or substantially triangular having a width that decreases from a drain side toward a source side.

Figure 3:
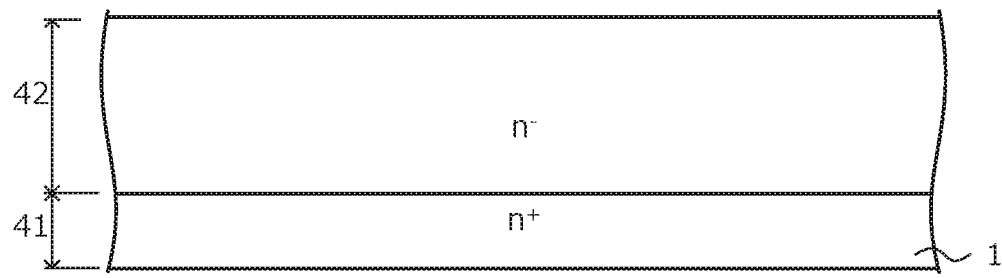
FIG. 3 is a cross-sectional view of the silicon carbide semiconductor device according to the embodiment during manufacture.

A method of manufacturing the silicon carbide semiconductor device 40 according to the embodiment will be described. FIGS. 3, 4, 5, 6, 8, 9, 10, 11, 12, 13, 14, and 15 are cross-sectional views of the silicon carbide semiconductor device according to the embodiment during manufacture. FIG. 7 is a plan view of the silicon carbide semiconductor device according to the embodiment during manufacture. First, as depicted in FIG. 3, the n+-type starting substrate (semiconductor wafer) 41 containing silicon carbide is prepared. The n+-type starting substrate 41, as described above, configures the n+-type drain region 1. Next, at the front surface of the n+-type starting substrate 41, the n−-type silicon carbide layer 42 having an impurity concentration that is lower than that of the n+-type starting substrate 41 is formed by epitaxial growth.

Figure 4:
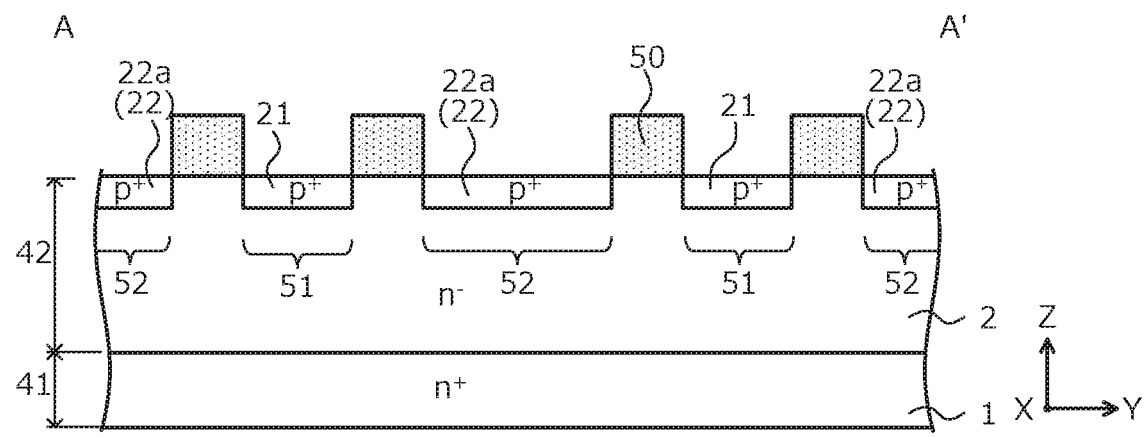
FIG. 4 is a cross-sectional view of the silicon carbide semiconductor device according to the embodiment during manufacture.
Figure 5:
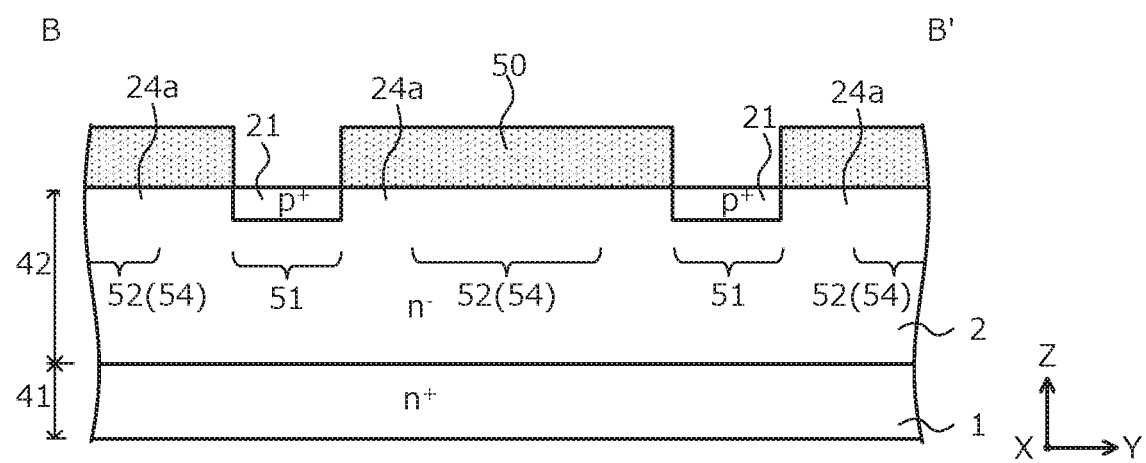
FIG. 5 is a cross-sectional view of the silicon carbide semiconductor device according to the embodiment during manufacture.
Figure 6:
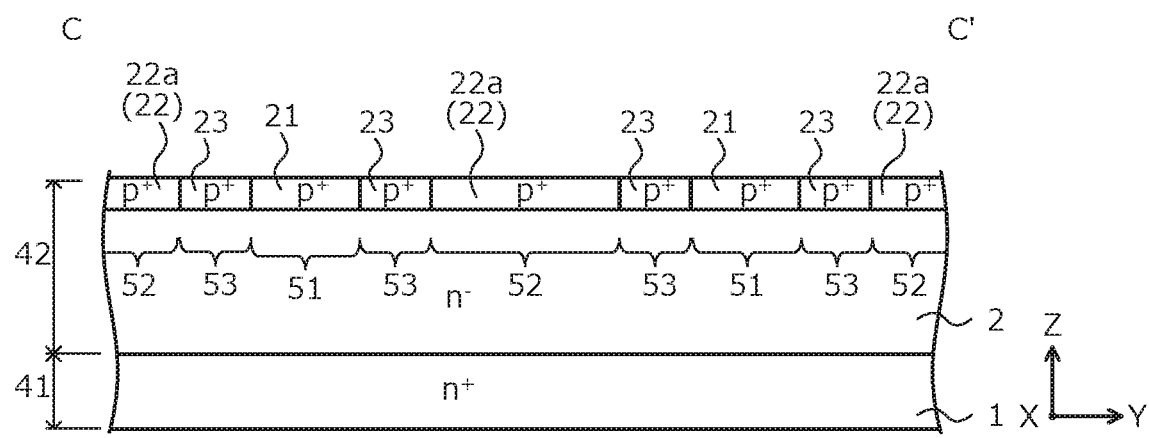
FIG. 6 is a cross-sectional view of the silicon carbide semiconductor device according to the embodiment during manufacture.
Figure 7:
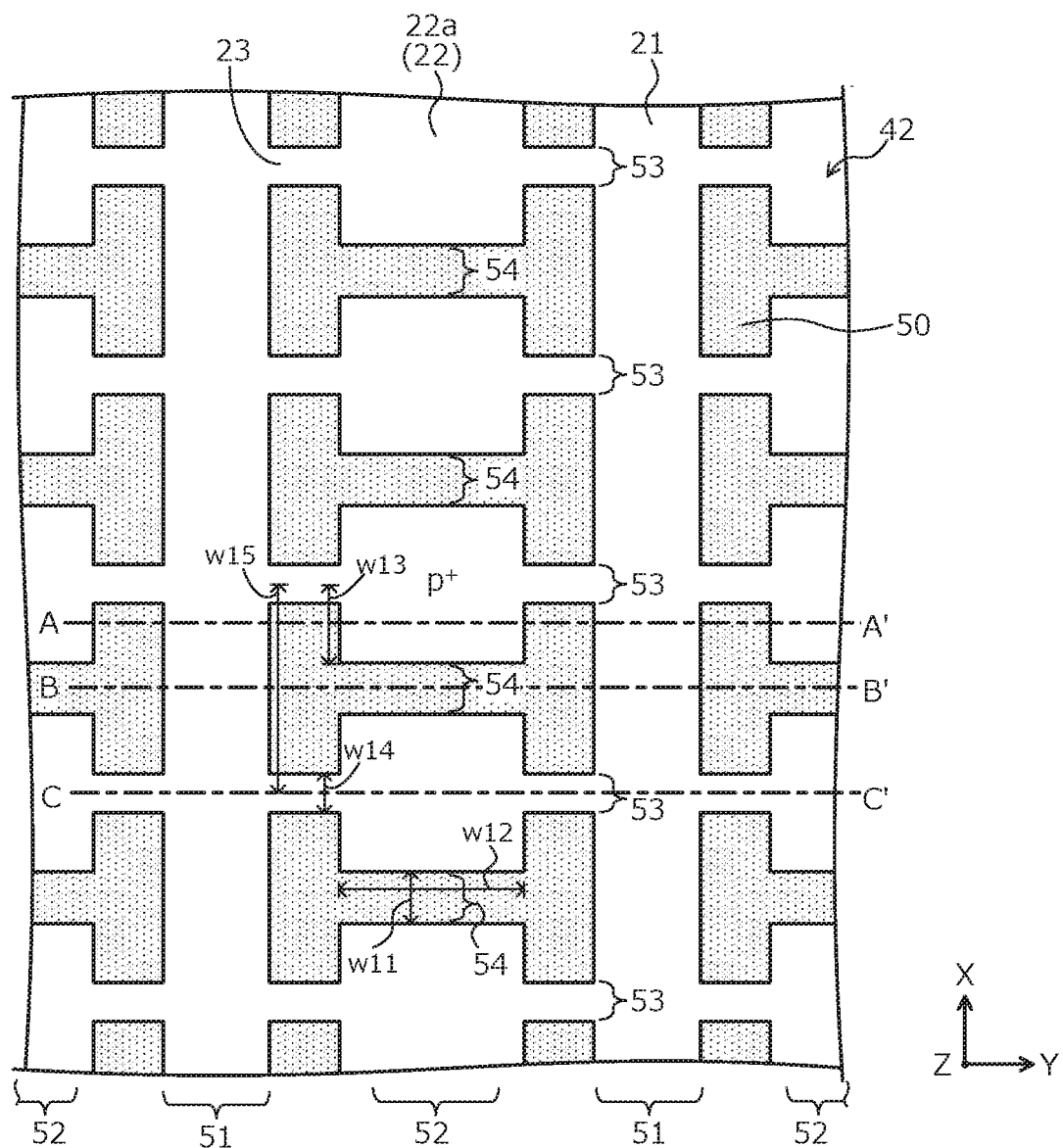
FIG. 7 is a plan view of the silicon carbide semiconductor device according to the embodiment during manufacture.

Next, as depicted in FIGS. 4 to 7, the first ion implantation mask 50 having opened portions that correspond to formation regions 51, 52, 53 of the first and the second p+-type regions 21, 22, and the p+-type connecting portion 23 is formed at a surface of the n−-type silicon carbide layer 42. At this time, of the formation regions 52 of the second p+-type region 22, a formation region 54 of the recessed portion 24 of the second p+-type region 22 is in a state of being covered by the first ion implantation mask 50 without being opened. As a result, the first ion implantation mask 50, as viewed from the front surface side of the semiconductor substrate 10, has a layout in which one or more portions covering the formation region 54 of the recessed portion 24 of the second p+-type region 22 is connected to a portion covering a region between the formation regions 53 of the p+-type connecting portions 23 that are adjacent in the first direction X. In FIGS. 4 to 7, the first ion implantation mask 50 is indicated by hatching. Further, FIGS. 4 to 6 depict cross-sectional views of structures along cutting lines A-A', B-B', C-C' in FIG. 7, respectively.

Next, a p-type impurity is ion implanted in the n−-type silicon carbide layer 42 using the first ion implantation mask 50 as a mask, thereby selectively forming the first p+-type region 21, a p+-type region (fourth second-conductivity-type region) 22a, and the p$^+$-type connecting portion 23 in a surface layer of the n$^-$-type silicon carbide layer 42. The first p$^+$-type regions 21 are formed in a layout of linear shapes extending in the first direction X. The p$^+$-type regions 22a are formed in a layout of island shapes interspersed at a predetermined interval in the first direction X, between the first p$^+$-type regions 21 that are adjacent. The p$^+$-type region 22a is a portion of the second p$^+$-type region 22.

Further, the first p$^+$-type region 21 and the p$^+$-type region 22a are disposed to repeatedly alternate each other in the second direction Y. Between the adjacent first p$^+$-type region 21 and the p$^+$-type region 22a, the p$^+$-type connecting portion 23 that connects the first p$^+$-type region 21 and the p$^+$-type region 22a is formed. Between the p$^+$-type regions 22a adjacent to each other in the first direction X is the formation region 54 of the recessed portion 24 of the second p$^+$-type region 22, and between the p$^+$-type regions 22a adjacent to each other in the first direction X is covered by the first ion implantation mask 50, whereby a portion 24a free of the implanted p-type impurity is formed. Further, the first ion implantation mask 50 is removed.

In the first ion implantation mask 50, the width w11 (in the first direction X) of the formation region 54 of the recessed portion 24 of the second p$^+$-type region 22 may be, for example, 0.4 μm or more. As a result, in the n-type current spreading region 3, breakdown voltage BVdss near (near a center of the mesa region) the second p$^+$-type region 22 may be made lower than breakdown voltage BVdss near (the trench 7 bottom) the first p$^+$-type region 21, to about a same extent as in the conventional structure (refer to FIGS. 21, 22). Further, the width w11 (in the first direction X) of a portion of the first ion implantation mask 50 covering the formation region 54 of the recessed portion 24 of the second p$^+$-type region 22 may be, for example, 1.4 μm or less. As a result, the leak current Idss between the drain and the source may be reduced more than in the conventional structure.

Figure 8:
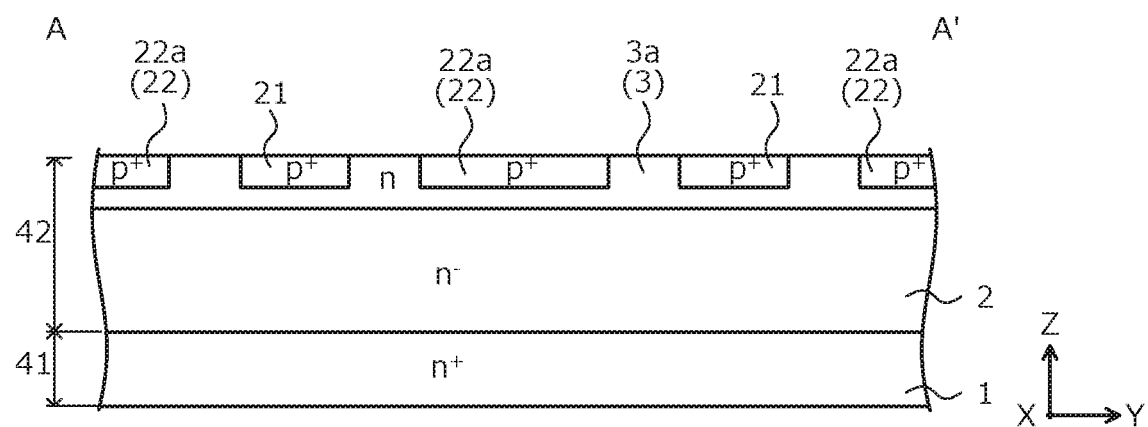
FIG. 8 is a cross-sectional view of the silicon carbide semiconductor device according to the embodiment during manufacture.
Figure 9:
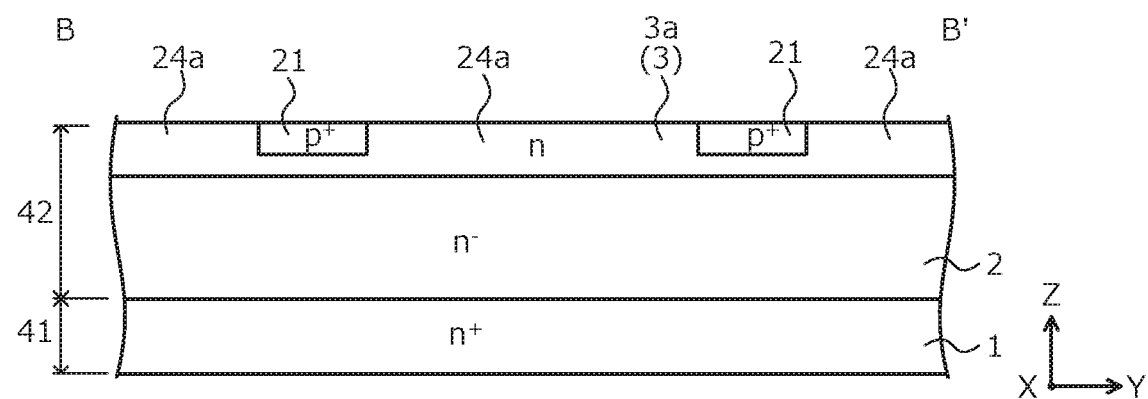
FIG. 9 is a cross-sectional view of the silicon carbide semiconductor device according to the embodiment during manufacture.
Figure 10:
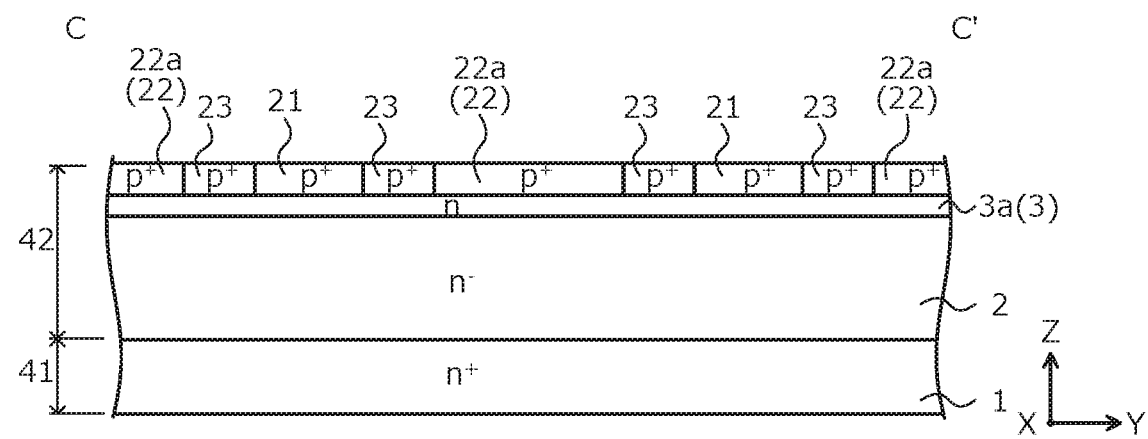
FIG. 10 is a cross-sectional view of the silicon carbide semiconductor device according to the embodiment during manufacture.

Next, as depicted in FIGS. 8 to 10, by ion implantation of an n-type impurity, for example, spanning the active region overall, an n-type region 3a is formed in a surface layer of the n$^-$-type silicon carbide layer 42. The n-type region 3a is a portion of the n-type current spreading region 3. FIGS. 8, 9, and 10 depict cross-sectional views of cross-sections corresponding to cross-sections along cutting lines A-A', B-B', and C-C' in FIG. 7, respectively. A formation sequence of the n-type region 3a, the first p$^+$-type region 21, and the p$^+$-type region 22a may be interchanged. A portion of the n$^-$-type silicon carbide layer 42 closer to the drain than is the n-type region 3a is the n$^-$-type drift region 2.

Figure 11:
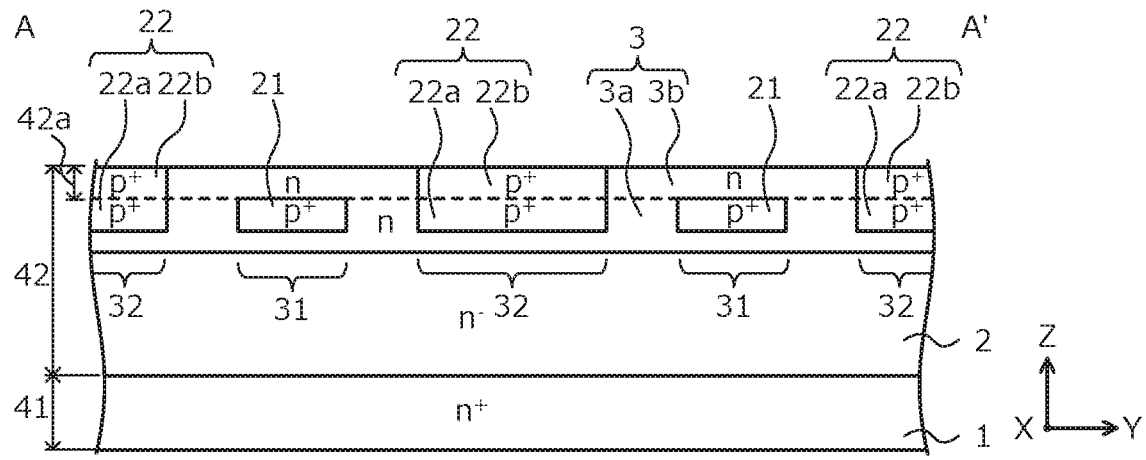
FIG. 11 is a cross-sectional view of the silicon carbide semiconductor device according to the embodiment during manufacture.
Figure 12:
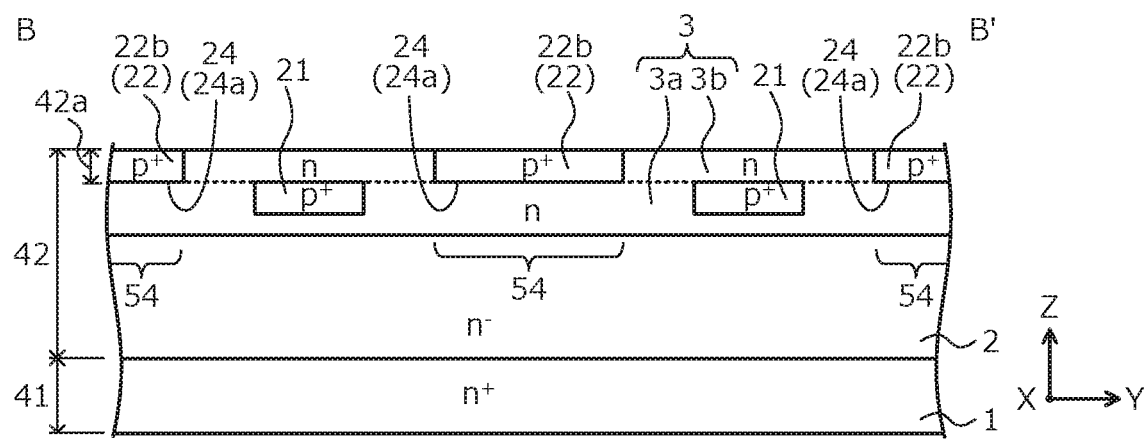
FIG. 12 is a cross-sectional view of the silicon carbide semiconductor device according to the embodiment during manufacture.
Figure 13:
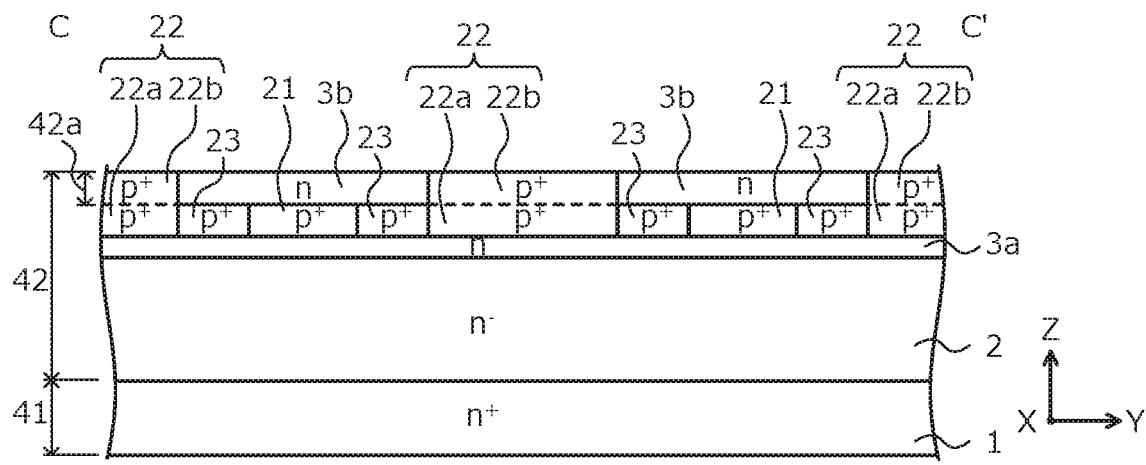
FIG. 13 is a cross-sectional view of the silicon carbide semiconductor device according to the embodiment during manufacture.

Next, as depicted in FIGS. 11 to 13, on the n$^-$-type silicon carbide layer 42, an n$^-$-type silicon carbide layer 42a is further formed by epitaxial growth, thereby increasing a thickness of the n$^-$-type silicon carbide layer 42. FIGS. 11 to 13 depict cross-sectional views of cross-sections corresponding to cross-sections along cutting lines A-A', B-B', and C-C' in FIG. 7, respectively. Next, at a surface of the n$^-$-type silicon carbide layer 42, a second ion implantation mask (not depicted) opened at portions corresponding to a formation region of the second p$^+$-type region 22 is formed.

While not depicted, in the second ion implantation mask, the formation region of the second p$^+$-type region 22 is opened in a striped shape extending in the first direction X. The p$^+$-type region 22a, and the portion 24a in the n$^-$-type silicon carbide layer 42 and in which no p-type region is introduced between the p$^+$-type regions 22a adjacent to each other are exposed in a linear shape in the first direction X in linear portions of opened portions having a striped shape in the second ion implantation mask.

Next, a p-type impurity is ion implanted in the n$^-$-type silicon carbide layer 42 using the second ion implantation mask as a mask. As a result, at the portion 42a that increases the thickness of the n$^-$-type silicon carbide layer 42, a p$^+$-type region (fifth second-conductivity-type region) 22b is selectively formed. The p$^+$-type region 22b is formed in a linear shape in the first direction X, from on the p$^+$-type region 22a and spanning on the portion 24a in which no p-type region is introduced between the p$^+$-type regions 22a adjacent to each other.

The p$^+$-type region 22b is formed at a depth reaching the p$^+$-type region 22a, whereby the p$^+$-type regions 22a, 22b are connected in the thickness direction Z, and the second p$^+$-type region 22 is formed to be partially thicker at a portion where the p$^+$-type regions 22a, 22b are connected. A width and an impurity concentration of the p$^+$-type region 22b are, for example, substantially the same as those of the p$^+$-type region 22a. Further, the p$^+$-type regions 22a, 22b are connected in the thickness direction Z, whereby the portion 24a in which no p-type region is introduced between the p$^+$-type regions 22a adjacent to each other becomes the recessed portion 24 of the p$^+$-type region 22a. Further, the second ion implantation mask used in forming the p$^+$-type region 22b is removed.

Next, by ion implantation of an n-type impurity, an n-type region 3b is formed in the portion 42a that increases the thickness of the n$^-$-type silicon carbide layer 42, for example, in the active region overall, at a depth reaching the n-type region 3a. An impurity concentration of the n-type region 3b is substantially the same as that of the n-type region 3a. The n-type regions 3a, 3b are connected in the thickness direction Z, whereby the n-type current spreading region 3 is formed. A formation sequence of the p$^+$-type region 22b and the n-type region 3b may be interchanged.

Figure 14:
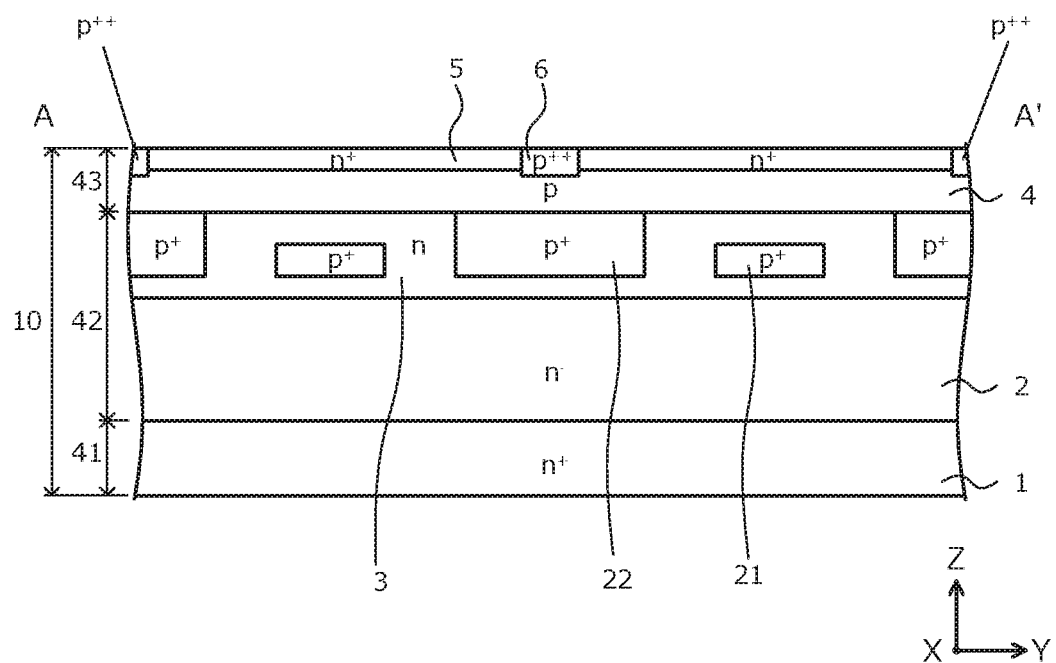
FIG. 14 is a cross-sectional view of the silicon carbide semiconductor device according to the embodiment during manufacture.
Figure 15:
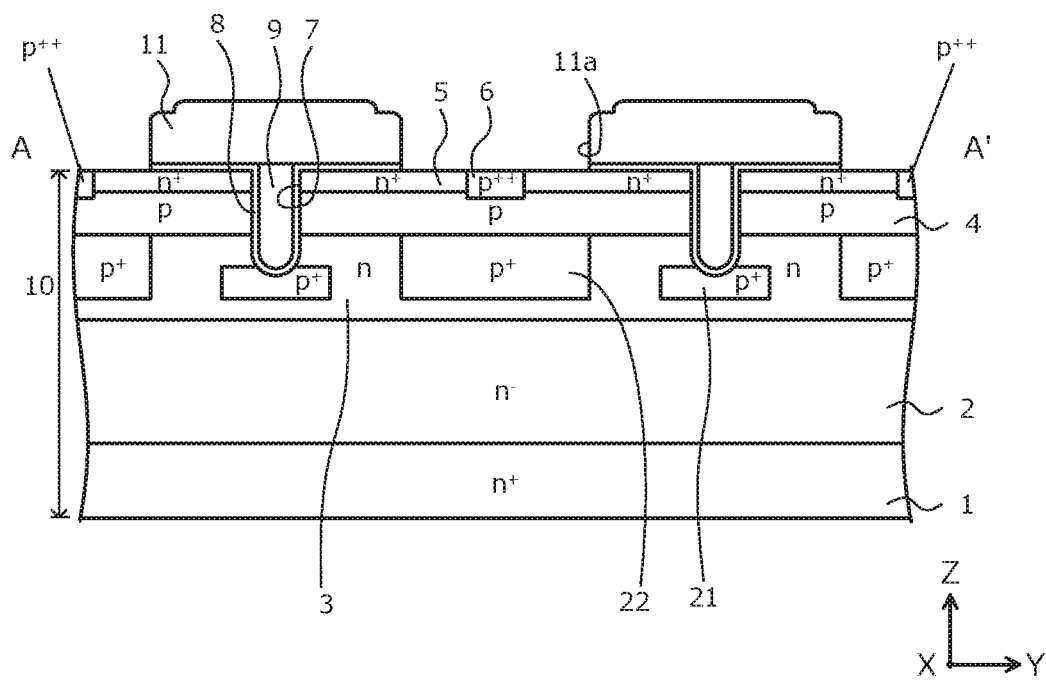
FIG. 15 is a cross-sectional view of the silicon carbide semiconductor device according to the embodiment during manufacture.

Next, as depicted in FIG. 14, on the n$^-$-type silicon carbide layer 42, the p-type silicon carbide layer 43 is formed by epitaxial growth. As a result, the semiconductor substrate (semiconductor wafer) 10 is formed in which the n$^-$-type silicon carbide layer 42 and the p-type silicon carbide layer 43 are sequentially stacked on the n$^+$-type starting substrate 41. FIGS. 14 and 15 depict cross-sectional views of cross-sections corresponding to cross-sections along cutting line A-A' in FIG. 7. Cross-sectional views of cross-sections corresponding to cross-sections along cutting lines B-B' and C-C' in FIG. 7 are not depicted in the drawings.

Next, a process including formation of an ion implantation mask, ion implantation of a dopant, and removal of the ion implantation mask as one set is repeatedly performed under different ion implantation conditions, selectively forming the n$^+$-type source region 5 and the p$^{++}$-type contact region 6 in a surface of the p-type silicon carbide layer 43. A formation sequence of the n$^+$-type source region 5 and the p$^{++}$-type contact region 6 may be interchanged. A portion of the p-type silicon carbide layer 43 other than the n$^+$-type source region 5 and the p$^{++}$-type contact region 6 is the p-type base region 4.

In the ion implantations described above, a resist mask may be used as an ion implantation mask, or an oxide mask may be used. Next, a heat treatment (activation annealing) for activating an impurity is performed for all diffusion regions (the first and the second p$^+$-type regions 21, 22, the p$^+$-type connecting portions 23, the n-type current spreading region 3, the n$^+$-type source regions 5, and the p$^{++}$-type contact regions 6) formed by ion implantation. The activation annealing may be performed once after all of the diffusion regions have been formed, or may be performed for each formation of a diffusion region by ion implantation.

Next, as depicted in FIG. 15, by photolithography and etching, the trench 7 that penetrates the n$^+$-type source region 5 and the p-type base region 4, and reaches the first p$^+$-type region 21 in the n-type current spreading region 3 is formed. As an etching mask for forming the trenches 7, for example, a resist mask or an oxide mask may be used. Subsequently, the etching mask used in forming the trenches 7 is removed. Next, along a surface of the semiconductor substrate 10 and an inner wall of each of the trenches 7, an oxide mask that becomes the gate insulating film 8 is formed.

Next, a poly-silicon (poly-Si) layer is deposited on the gate insulating film 8 so as to be embedded in the trenches 7. Subsequently, the poly-silicon layer is patterned, and a portion that becomes the gate electrode 9 is left in the trenches 7. Next, the interlayer insulating film 11 is formed at the front surface of the semiconductor substrate 10 overall so as to cover the gate insulating film 8 and the gate electrodes 9. Next, the interlayer insulating film 11 and the gate insulating film 8 are selectively removed, thereby forming a contact hole 11a in which the n$^+$-type source region 5 and the p$^{++}$-type contact region 6 are exposed. Next, the interlayer insulating film 11 is planarized by a heat treatment (reflow).

Next, the source electrode 12 is formed on the front surface of the semiconductor substrate 10 so as to be embedded in each of the contact holes 11a of the interlayer insulating film 11. At the rear surface of the semiconductor substrate 10 overall, the drain electrode 13 is formed. Thereafter, the semiconductor substrate (semiconductor wafer) 10 is diced (cut) into individual chips, whereby the MOSFET depicted in FIGS. 1 and 2 is completed.

As described above, according to the embodiment, a recessed portion that is a portion of the surface facing toward the drain, recessed toward the source is provided in the second p$^+$-type region provided in the n-type current spreading region, whereby a concentration of electric field at the recessed portion of the second p$^+$-type region occurs. As a result, the breakdown voltage obtained by the pn junction between the n-type current spreading region and the second p$^+$-type region of the mesa region may be set to be lower than the breakdown voltage obtained by the pn junction between the n-type current spreading region and the first p$^+$-type region of the trench bottom, whereby an occurrence of avalanche breakdown at the trench bottom may be suppressed. Therefore, the n-type region directly beneath the second p$^+$-type region is not necessary like in the conventional structure (refer to FIGS. 21, 22).

Further, according to the embodiment, the breakdown voltage obtained by the pn junction between the n-type current spreading region and the second p$^+$-type region is reduced, whereby the breakdown voltage of the active region may be reduced to be lower than the breakdown voltage of the edge termination region. Further, according to the embodiment, disposal of the recessed portions of the second p$^+$-type region of the mesa region and adjustment of the width of the recessed portion in the first direction enable easy adjustment of paths of current that flows due to avalanche breakdown and thereby, enables enhancement of the reliability. Further, according to the embodiment, the width (in the first direction) of the recessed portion of the second p$^+$-type region is set to be narrow, whereby the breakdown voltage may be reduced and the leak current between the drain and the source may be reduced. Further, by increasing the number of the recessed portions of the second p$^+$-type region, the breakdown voltage may be enhanced.

Further, according to the embodiment, processes for forming the n-type region directly beneath the second p$^+$-type region as in the conventional structure, may be omitted. In addition, the recessed portion of the second p$^+$-type region may be easily formed by changing the layout of the first ion implantation mask for forming the second p$^+$-type region and therefore, an addition of new processes is unnecessary. Thus, the manufacturing process may be simplified.

Figure 16:
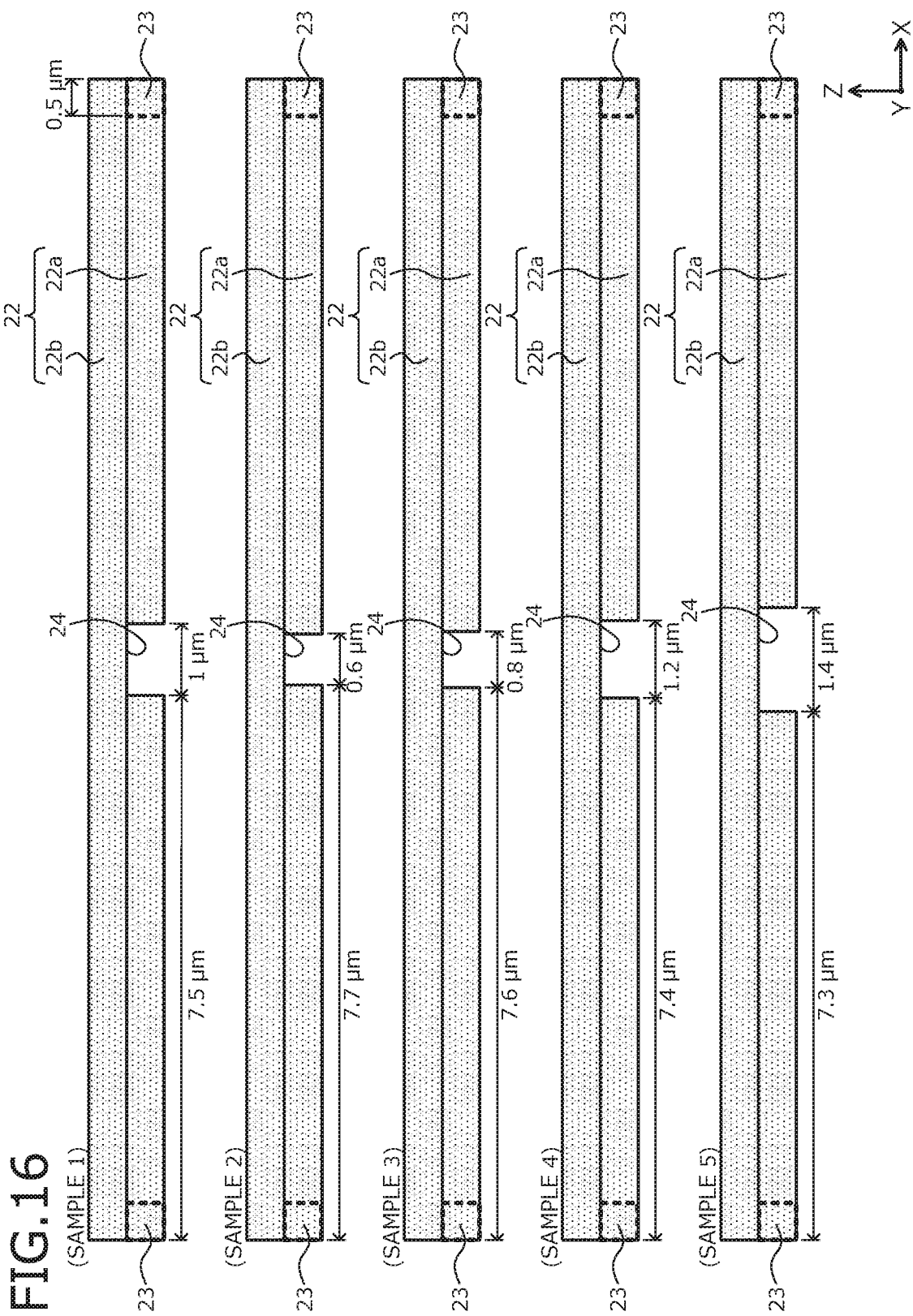
FIG. 16 is a cross-sectional view of a portion of samples of a first example.

Verification regarding the width w1 of the recessed portion 24 of the second p$^+$-type region 22 in the first direction X (refer to FIG. 2) was performed. FIG. 16 is a cross-sectional view of a portion of samples of a first example. The width w1 of the recessed portion 24 of the second p$^+$-type region 22 in the first direction X is the width on the p$^+$-type region 22b side of the recessed portion 24 of the second p$^+$-type region 22. When the width w1 of the recessed portion 24 of the second p$^+$-type region 22 in the first direction X is 0 μm, the recessed portion 24 of the second p$^+$-type region 22, for example, has a cross-sectional shape that is elliptical, trapezoidal, or substantially triangular having a width that decreases from the drain side toward the source side (similarly in a second example).

As depicted in FIG. 16, five MOSFETs that have the structure of the described silicon carbide semiconductor device 40 according to the embodiment were fabricated by changing the width w1 of the recessed portion 24 of the second p$^+$-type region 22 in the first direction X (hereinafter, samples 1 to 5 of the first example). In all of the samples of the first example, one of the recessed portions 24 is provided at a center along the first direction X between the connection sites in the second p$^+$-type region 22 for connection with the p$^+$-type connecting portions 23 that are adjacent to each other in the first direction X. FIG. 16 depicts a portion between centers of the connection sites of the second p$^+$-type region 22 of the samples 1 to 5 of the first example, the connection sites for connection with the p$^+$-type connecting portion 23 adjacent in the first direction X.

Actual dimensions depicted in FIG. 16 are an opening width or a mask width remaining between adjacent openings (hereinafter, remaining width) of the first ion implantation mask 50 (refer to FIG. 7) used in forming the first and the second p$^+$-type regions 21, 22 and the p$^+$-type connecting portion 23 (similarly in the second example). In particular, the actual dimensions depicted in FIG. 16 are the actual dimensions of the remaining width w11 in the first direction X of the first ion implantation mask 50 and an opening width w13 in the first direction X from the recessed portion 24 of the second p$^+$-type region 22 to the center of the p$^+$-type connecting portion 23 adjacent to the recessed portion 24.

In the samples 1 to 5 of the first example, the remaining widths w11 in the first direction X of the first ion implantation mask 50 and the opening widths w13 in the first direction X of the first ion implantation mask 50 respectively differ. In particular, in the samples 1 to 5 of the first example, the remaining width w11 in the first direction X of the first ion implantation mask 50 are 1 μm, 0.6 μm, 0.8 μm, 1.2 μm, and 1.4 μm, and the opening width w13 in the first direction X of the first ion implantation mask 50 are 7.5 μm, 7.7 μm, 7.6 μm, 7.4 μm, and 7.3 μm, respectively.

A remaining width w12 in the second direction Y of a portion of the first ion implantation mask 50 covering the formation region 54 of the recessed portion 24 of the second p$^+$-type region 22 was set to be a same dimension in all of the samples (similarly in the second example). The remaining widths w11, w12 in the first and the second directions X, Y and the opening width w13 in the first direction X of the first ion implantation mask 50 respectively correspond to the widths w1, w2 in the first and the second directions X, Y of the recessed portion 24 of the second p+-type region 22, and a width w3 from the recessed portion 24 of the second p+-type region 22 to a center of the p+-type connecting portion 23 (refer to FIG. 2).

Further, in the first ion implantation mask 50, an opening width w14 in the first direction X of an opening that exposes the formation region 53 of the p+-type connecting portion 23 and a width w15 between centers of openings that expose the formation region 53 of the p+-type connecting portion 23 adjacent in the first direction X are 1 μm and 16 μm, respectively, and were set to be the same dimensions in all the samples (similarly in the second example). In the first ion implantation mask 50, the opening width w14 in the first direction X and the width w15 in the first direction X respectively correspond to a width w4 in the first direction X of the p+-type connecting portion 23 and a width w5 between centers of the p+-type connecting portion 23 adjacent to each other in the first direction X (refer to FIG. 2).

Figure 17:
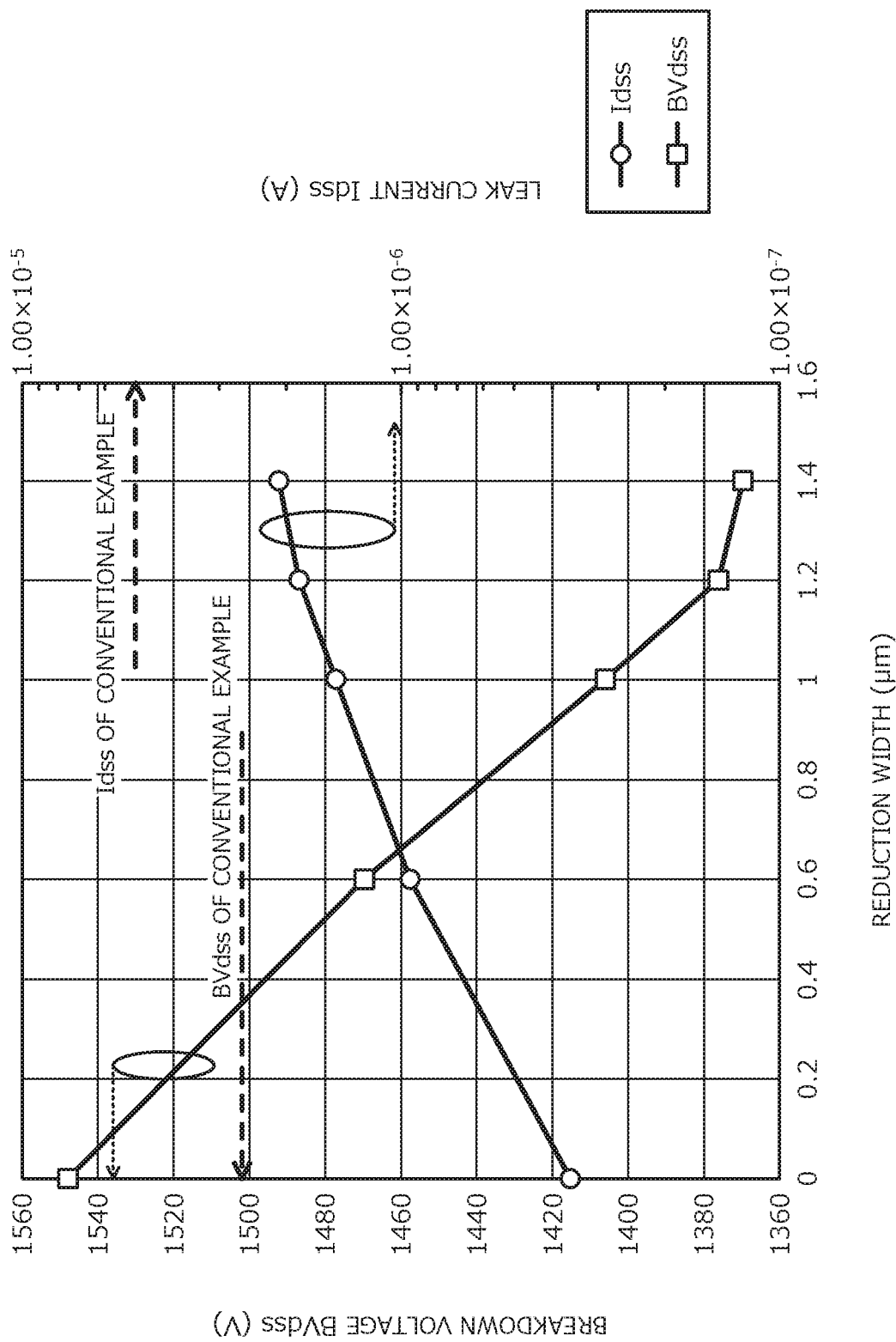
FIG. 17 is a characteristics diagram depicting a relationship between reduction width of a second $p^+$-type region, breakdown voltage BVdss, and leak current Idss between the drain and the source in the first example.

In the samples 1 to 5 of the first example, a relationship between the remaining width w11 (reduction width of the second p+-type region 22 in FIG. 17) in the first direction X of the first ion implantation mask 50, the breakdown voltage BVdss, and the leak current Idss between the drain and the source is depicted in FIG. 17. FIG. 17 is a characteristics diagram depicting a relationship between the reduction width of the second p+-type region, the breakdown voltage BVdss, and the leak current Idss between the drain and the source in the first example. The width w1 of the recessed portion 24 of the second p+-type region 22 in the first direction X is a dimension obtained by subtracting 0.4 μm from the remaining width w11 of the first ion implantation mask 50 in the first direction X.

In other words, the remaining width w11 of the first ion implantation mask 50 in the first direction X is as wide as a diffusion length of the second p+-type region 22 by the activation annealing. After the activation annealing, the width w1 of the recessed portion 24 of the second p+-type region 22 in the first direction X becomes narrower than the remaining width w11 of the first ion implantation mask 50 in the first direction X by about 0.2 μm inward from each side in the first direction X, becoming narrower by a total of about 0.4 μm. The width w3 from the recessed portion 24 of the second p+-type region 22 to the center of the p+-type connecting portion 23 becomes wider corresponding to the width w1 of the recessed portion 24 of the second p+-type region 22 in the first direction X.

In the first example, voltage that is positive relative to the source electrode 12 and applied to the drain electrode 13 was set to be 1200V. In FIG. 17, the remaining width w11 of the first ion implantation mask 50 in the first direction X (hereinafter, reduction width of the second p+-type region 22)=0 μm is a sample (hereinafter, first comparison example: refer to FIG. 18) in which the recessed portion 24 is not provided in the second p+-type region 22. Further, in FIG. 17, breakdown voltage BVdss and leak current Idss between the drain and the source of the conventional structure (refer to FIGS. 21, 22: hereinafter, first conventional example) are indicated by dashed-line arrows. The first conventional example differs from the first comparison example in that the n+-type region 124 is provided directly beneath the second p+-type region 122.

From the results depicted in FIG. 17, it was confirmed that by providing the recessed portion 24 in the second p+-type region 22 as in the first example, similarly to the first conventional example, in the n-type current spreading region 3, the breakdown voltage BVdss near the second p+-type region 22 (near the center of the mesa region) may be reduced to be lower than the breakdown voltage BVdss near the first p+-type region 21 (the trench 7 bottom). Further, it was confirmed that in the first example, in setting the breakdown voltage BVdss near the second p+-type region 22 to be about the same as that in the first conventional example or lower than that in the first conventional example, the reduction width of the second p+-type region 22 suffices to be set to 0.4 μm or more.

Further, it was confirmed that the first example may reduce the leak current Idss between the drain and the source more than the first conventional example. For example, even when the reduction width of the second p+-type region 22 was widened to 1.4 μm, the leak current Idss between the drain and the source could be reduced more than in the first conventional example. Accordingly, in the first example, the reduction width of the second p+-type region 22, for example, may be determined in a range from about 0.4 μm to 1.4 μm with consideration of a tradeoff relationship between the breakdown voltage BVdss and the leak current Idss between the drain and the source.

Figure 18:
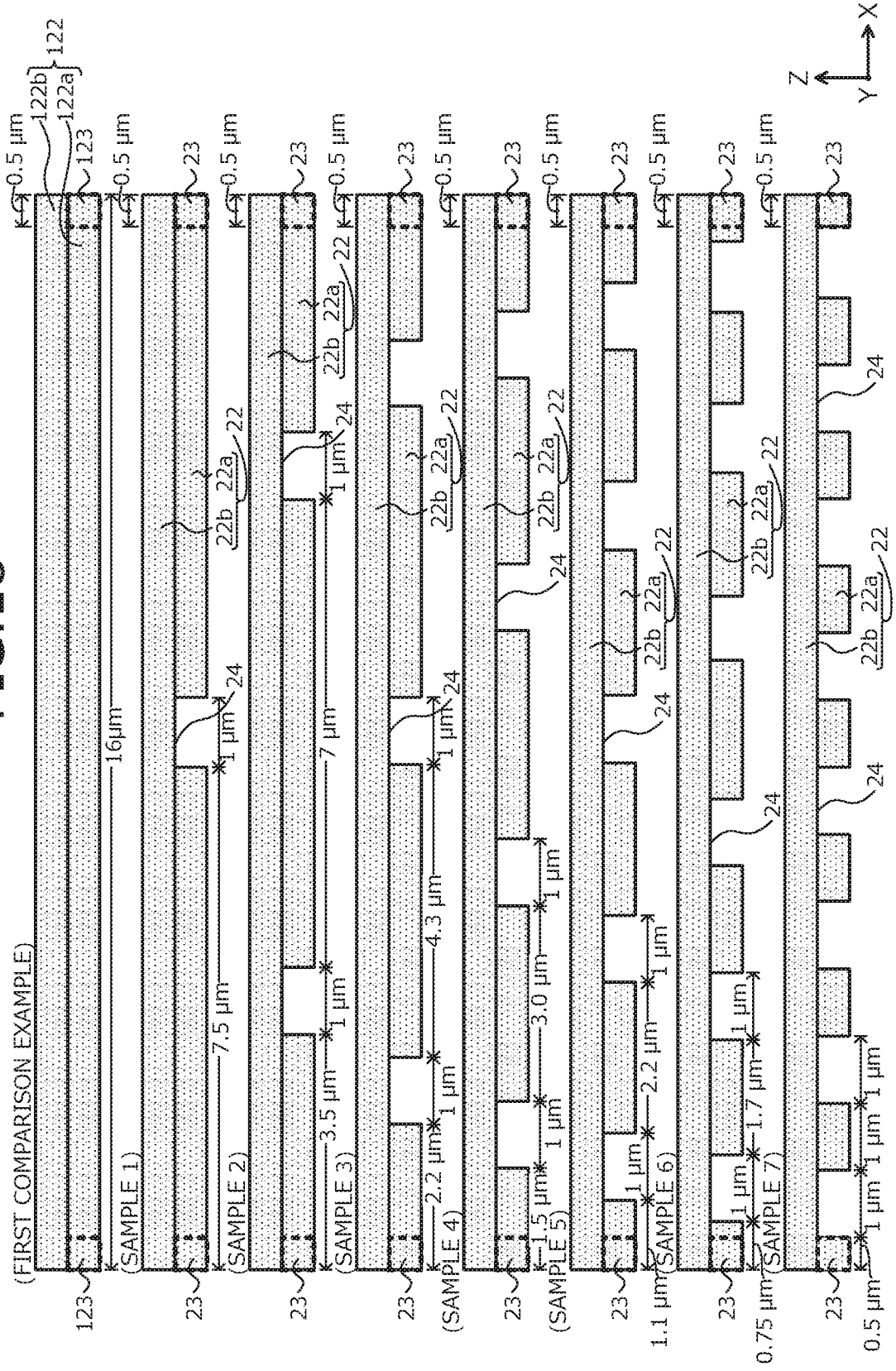
FIG. 18 is a cross-sectional view of a portion of samples of a second example.

Verification regarding the number of the recessed portions 24 of the second p+-type region 22 was performed. FIG. 18 is a cross-sectional view of a portion of samples of a second example. As depicted in FIG. 18, seven MOSFETs having the structure of the described silicon carbide semiconductor device 40 according to the embodiment were fabricated by changing the number of the recessed portions 24 disposed between the connection sites in the second p+-type region 22 for connection with the p+-type connecting portions 23 that are adjacent to each other in the first direction X (hereinafter, samples 1 to 7 of the second example). FIG. 18 depicts a portion between the centers of the connection sites of the second p+-type region 22 in the samples 1 to 7 of the second example, the connection sites for connection with the p+-type connecting portions 23 that are adjacent to each other in the first direction X.

In the samples 3 to 7 of the second example, a width between the recessed portions 24 that are adjacent to each other and disposed between the connection sites in the second p+-type region 22 for connection with the p+-type connecting portions 23 that are adjacent to each other in the first direction X are set to be equal. The actual dimensions depicted in FIG. 18 are the remaining width w11 of the first ion implantation mask 50 in the first direction X (reduction width of the second p+-type region 22) and the opening width w13 of the first ion implantation mask 50 in the first direction X. In the samples 3 to 7 of the second example, the actual dimension of a width of the first ion implantation mask 50, from the formation region 54 of the recessed portion 24 of the second p+-type region 22, to the formation region 54 adjacent to the formation region 54 is also depicted.

In the samples 1 to 7 of the second example, the number of the recessed portions 24 disposed between the connection sites in the second p+-type region 22 for connection with the p+-type connecting portions 23 that are adjacent to each other in the first direction X is 1, 2, 3, 4, 5, 6, and 8, respectively, and the opening width w13 of the first ion implantation mask 50 in the first direction X is 7.5 μm, 3.5 μm, 2.2 μm, 1.5 μm, 1.1 μm, 0.75 μm, and 0.5 μm, respectively. In other words, in the sample 7 of the second example, the recessed portion 24 of the second p$^+$-type region 22 is in contact with the p$^+$-type connecting portion 23.

In the sample 2 of the second example, in the second p$^+$-type region 22, a width between the recessed portions 24 that are adjacent to each other and disposed between the centers of the p$^+$-type connecting portions 23 that are adjacent to each other in the first direction X is 7 μm. In the samples 3 to 7 of the second example, a width between the recessed portions 24 that are adjacent to each other and disposed between the connection sites in the second p$^+$-type region 22 for connection with the p$^+$-type connecting portions 23 that are adjacent to each other in the first direction X is 4.3 μm, 3.0 μm, 2.2 μm, 1.7 μm, and 1 μm, respectively. The remaining width w11 of the first ion implantation mask 50 in the first direction X (reduction width of the second p$^+$-type region 22) was set to be 1 μm in all the samples of the second example.

Figure 19:
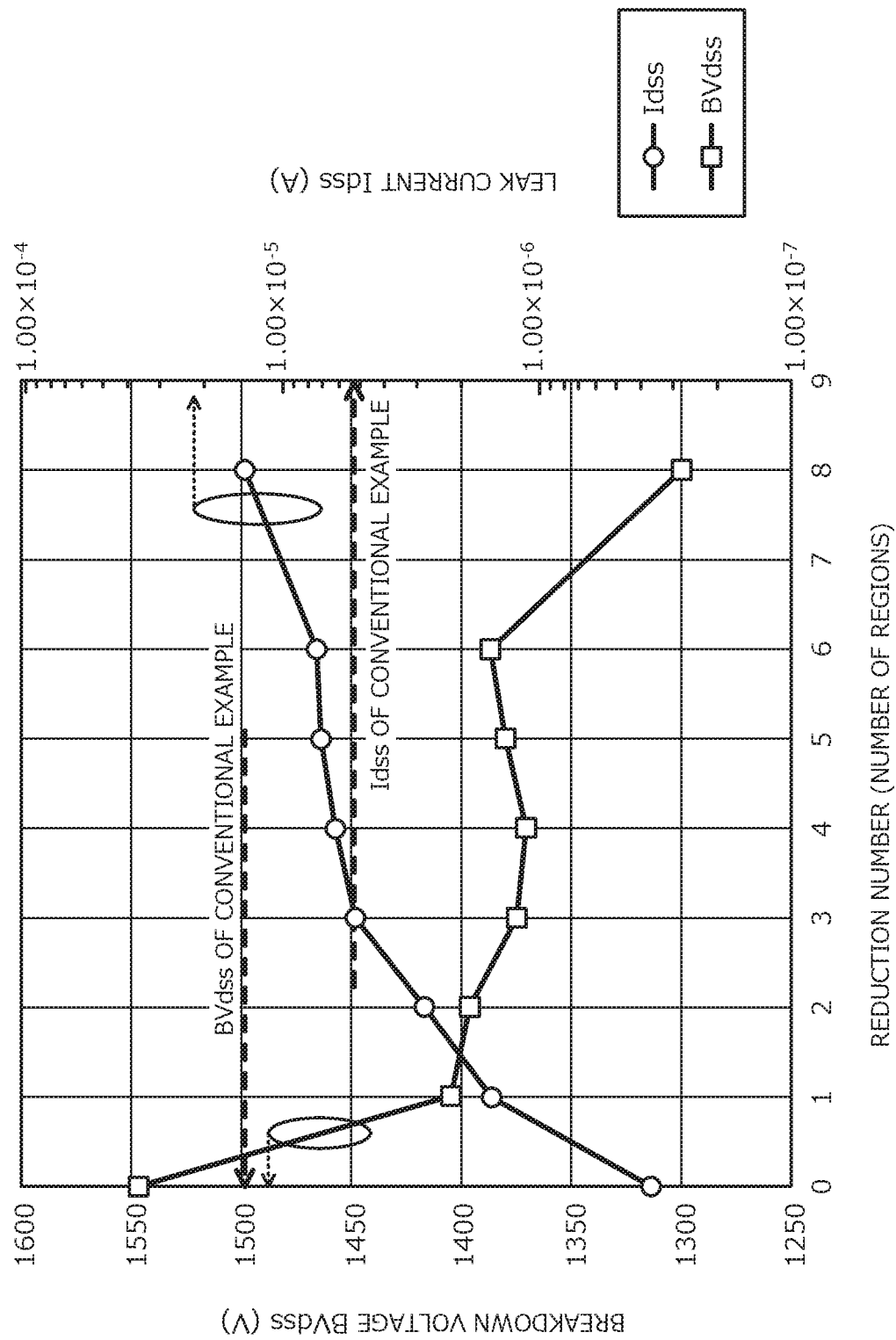
FIG. 19 is a characteristics diagram depicting a relationship between the reduction number of the second $p^+$-type region, the breakdown voltage BVdss, and the leak current Idss between the drain and the source in the second example.
Figure 20:
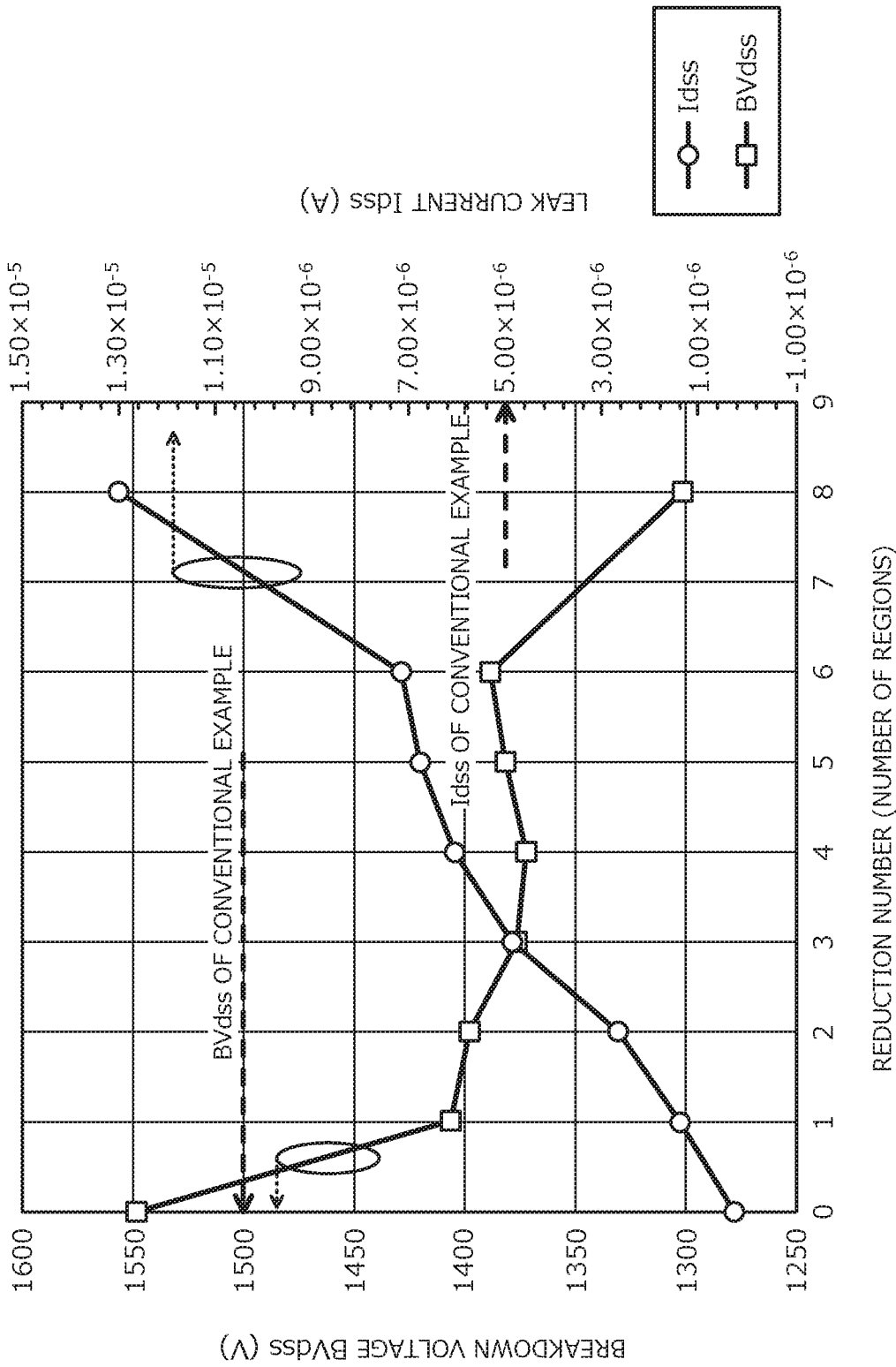
FIG. 20 is a characteristics diagram depicting a relationship between the reduction number of the second $p^+$-type region, the breakdown voltage BVdss, and the leak current Idss between the drain and the source in the second example.

In the samples 1 to 7 of the second example, a relationship between the number (reduction number of the second p$^+$-type region 22) of the recessed portions 24 disposed between the connection sites in the second p$^+$-type region 22 for connection with the p$^+$-type connecting portions 23 that are adjacent to each other in the first direction X, the breakdown voltage BVdss, and the leak current Idss between the drain and the source is depicted in FIGS. 19 and 20. FIGS. 19 and 20 are characteristics diagrams depicting a relationship between the reduction number of the second p$^+$-type region, the breakdown voltage BVdss, and the leak current Idss between the drain and the source in the second example.

FIGS. 19 and 20 are results based on the same samples and in FIG. 20, a scale of the leak current Idss between the drain and the source in FIG. 19 is switched from logarithmic to linear. In the second example, voltage that is positive relative to the source electrode 12 and applied to the drain electrode 13 was set to be 1200V. In FIGS. 19 and 20, the reduction number of the second p$^+$-type region 22=0 is the first comparison example described above. Further, in FIGS. 19 and 20, the breakdown voltage BVdss and the leak current Idss between the drain and the source in first conventional example described above are indicated by dashed-line arrows.

From the results depicted in FIGS. 19 and 20, it was confirmed that in the samples 1 to 6 of the second example, when the reduction width of the second p$^+$-type region 22 is the same, even when the reduction number of the second p$^+$-type region 22 is increased, the breakdown voltage BVdss does not substantially change. On the other hand, in the sample 7 of the second example, the recessed portion 24 of the second p$^+$-type region 22 and the p$^+$-type connecting portion 23 being adjacent to each other is considered to cause the breakdown voltage BVdss to decrease. It was confirmed that it is advantageous for the recessed portion 24 of the second p$^+$-type region 22 and the p$^+$-type connecting portion 23 to be separated from each other in the first direction X by 0.25 μm or more like in the samples 1 to 6 of the second example.

On the other hand, in the second example, it was confirmed that the leak current Idss between the drain and the source increases accompanying increases in the reduction number of the second p$^+$-type region 22. In suppressing the leak current Idss between the drain and the source more than in the first conventional example, it was confirmed that setting the reduction number of the second p$^+$-type region 22 to be 3 or less is advantageous. Further, when the reduction number of the second p$^+$-type region 22 is increased, in suppressing the leak current Idss between the drain and the source more than in the first conventional example, it was confirmed that reducing the reduction width of the second p$^+$-type region 22 is advantageous (refer to FIG. 17).

In the forgoing, the present invention is not limited to the embodiments described above and various modifications within a range not departing from the spirit of the invention are possible. For example, one of the p$^+$-type connecting portions is disposed between one pair the first and the second p$^+$-type regions that are adjacent and extend parallel to the first direction X, and the pair of the first and the second p$^+$-type regions and the one p$^+$-type connecting portion may be disposed, for example, in an H-shape when viewed from the front surface of the semiconductor substrate. In this case, one or more of the recessed portions of the p$^+$-type region suffices to be provided between the connection site of the p$^+$-type connecting portion and an end portion of the second p$^+$-type region.

Further, in the embodiments described above, while a MOSFET is described as an example, application is further possible to an insulated gate bipolar transistor (IGBT). Further, the structure may be such that the p-type base region and the n$^-$-type drift region contact each other without providing the n-type current spreading region. In this case, in the n$^-$-type drift region, the first and the second p$^+$-type region that mitigate electric field applied to the gate insulating film when the MOSFET is OFF are provided.

According to the present invention described above, electric field concentration occurs at the recessed portion of the second second-conductivity-type region between (mesa region) the trenches and therefore, the breakdown voltage obtained by the pn junction between the second semiconductor layer and the second-conductivity-type region may be set lower than the breakdown voltage obtained by the pn junction between the second semiconductor layer and the first second-conductivity-type region. Further, according to the invention described above, the breakdown voltage obtained by the pn junction between the second semiconductor layer and the second-conductivity-type region is reduced and therefore, the n-type region directly beneath the second second-conductivity-type region in the mesa region is not necessary like in the conventional structure (refer to FIGS. 21 and 22). Therefore, processes for forming the n-type regions may be omitted. Further, the recessed portion of the second p$^+$-type region may be easily formed by changing the layout of the first ion implantation mask for forming the second p$^+$-type region and therefore, an addition of new processes is unnecessary.

The silicon carbide semiconductor device and the method of manufacturing a silicon carbide semiconductor device according to the embodiments of the present invention achieve an effect in that an occurrence of avalanche breakdown at the trench bottom may be suppressed and the manufacturing process may be simplified.

As described, the silicon carbide semiconductor device and the method of manufacturing a silicon carbide semiconductor device according to the present invention are useful for power semiconductor devices used in power converting equipment and in power supply devices such as in industrial machines, and are particularly suitable for vertical MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
a semiconductor substrate containing silicon carbide;
a first semiconductor layer configuring a rear surface of the semiconductor substrate;
a second semiconductor layer of a first conductivity type and configuring the semiconductor substrate, the second semiconductor layer disposed in contact with the first semiconductor layer, closer to a front side of the semiconductor substrate than is the first semiconductor layer;
a third semiconductor layer of a second conductivity type and configuring a front surface of the semiconductor substrate, the third semiconductor layer being a portion of the semiconductor substrate other than the first semiconductor layer and the second semiconductor layer;
a first semiconductor region of the first conductivity type and selectively provided in the third semiconductor layer;
a second semiconductor region of the second conductivity type, the second semiconductor region being a portion of the third semiconductor layer other than the first semiconductor region;
a trench that penetrates the first semiconductor region and the second semiconductor region, and reaches the second semiconductor layer, the trench extending in a linear shape in a first direction parallel to the front surface of the semiconductor substrate;
a gate electrode provided in the trench via a gate insulating film;
a first second-conductivity-type region extending in a linear shape in the first direction and selectively provided in the second semiconductor layer, the first second-conductivity-type region facing a bottom of the trench in a thickness direction and separated from the second semiconductor region;
a second second-conductivity-type region extending in a linear shape in the first direction and provided in the second semiconductor layer, the second second-conductivity-type region being separated from the trench and the first second-conductivity-type region, and in contact with the second semiconductor region;
a plurality of third second-conductivity-type regions provided in the second semiconductor layer, between the first second-conductivity-type region and the second second-conductivity-type region, the plurality of third second-conductivity-type regions being interspersed at a predetermined interval in the first direction and partially connecting the first second-conductivity-type region and the second second-conductivity-type region;
a first electrode disposed at the front surface of the semiconductor substrate and electrically connected to the first semiconductor region and the second semiconductor region; and
a second electrode provided at the rear surface of the semiconductor substrate and electrically connected to the first semiconductor layer, wherein
the second second-conductivity-type region has at a portion of a surface on a side thereof facing toward the second electrode, one or more recessed portions recessed toward the first electrode, and
the one or more recessed portions is provided between connection sites between the second second-conductivity-type region and the plurality of third second-conductivity-type regions that are adjacent in the first direction.

2. The silicon carbide semiconductor device according to claim 1, wherein
an equal number of the one or more recessed portions is provided between all the connection sites between the second second-conductivity-type region and the plurality of third second-conductivity-type regions that are adjacent in the first direction.

3. The silicon carbide semiconductor device according to claim 1, wherein
the one or more recessed portions is provided at equal intervals between the connection sites between the second second-conductivity-type region and the plurality of third second-conductivity-type regions that are adjacent in the first direction.

4. The silicon carbide semiconductor device according to claim 1, wherein
the one or more recessed portions is provided separated from the connection sites between the second second-conductivity-type region and the plurality of third second-conductivity-type regions, in the first direction.

5. The silicon carbide semiconductor device according to claim 4, wherein
the one or more recessed portions is provided separated from the connection sites between the second second-conductivity-type region and the plurality of third second-conductivity-type regions by at least 0.25 μm in the first direction.

6. The silicon carbide semiconductor device according to claim 1, wherein
all the one or more recessed portions has a same width in the first direction.

7. The silicon carbide semiconductor device according to claim 1, further comprising
a third semiconductor region of the first conductivity type in a surface layer on a side of the second semiconductor layer forming an interface with the third semiconductor layer, the third semiconductor region having an impurity concentration that is higher than an impurity concentration of the second semiconductor layer, wherein
the bottom of the trench terminates in the third semiconductor region, and
the first second-conductivity-type region, the second second-conductivity-type region, and the third second-conductivity-type region are selectively provided in the third semiconductor region.

8. The silicon carbide semiconductor device according to claim 1 made by a method, the method comprising:
depositing a second semiconductor layer containing silicon carbide on a surface of a first semiconductor layer containing silicon carbide;
forming on a surface of the second semiconductor layer, a first ion implantation mask having a first opening corresponding to a formation region of a first second-conductivity-type region, a second opening corresponding to a formation region of a second second-conductivity-type region, and a third opening corresponding to a formation region of a third second-conductivity-type region;
selectively forming the first second-conductivity-type region, a fourth second-conductivity-type region, and the third second-conductivity-type region in a surface layer of the second semiconductor layer by ion implanting a second conductivity-type impurity using the first ion implantation mask;
removing the first ion implantation mask after selectively forming the first second-conductivity-type region, the fourth second-conductivity-type region, and the third second-conductivity-type region;

increasing a thickness of the second semiconductor layer by depositing a first-conductivity-type semiconductor layer on a surface of the second semiconductor layer after removing the first ion implantation mask;

forming at the surface of the second semiconductor layer after increasing the thickness of the second semiconductor layer, a second ion implantation mask having a fourth opening corresponding to a formation region of the second second-conductivity-type region;

ion implanting a second-conductivity-type impurity using the second ion implantation mask and thereby selectively forming in a portion that increases the thickness of the second semiconductor layer, a fifth second-conductivity-type region at a depth reaching the fourth second-conductivity-type region and forming the second second-conductivity-type region by connecting in a thickness direction, the fourth second-conductivity-type region and the fifth second-conductivity-type region;

removing the second ion implantation mask after forming the second second-conductivity-type region;

depositing on the surface of the second semiconductor layer after removing the second ion implantation mask, a third semiconductor layer containing silicon carbide and thereby fabricating a semiconductor substrate having the first semiconductor layer, the second semiconductor layer, and the third semiconductor layer, a rear surface configured by the first semiconductor layer and a front surface configured by the third semiconductor layer;

selectively forming in the third semiconductor layer, a first semiconductor region of a first conductivity type, a portion of the third semiconductor layer excluding the first semiconductor region being a second semiconductor region of a second conductivity type;

forming separated from the second second-conductivity-type region, a trench that penetrates the first semiconductor region and the second semiconductor region, and reaches the second semiconductor layer, a bottom facing the first second-conductivity-type region in a depth direction;

forming a gate electrode in the trench via a gate insulating film;

forming at the front surface of the semiconductor substrate, a first electrode electrically connected to the first semiconductor region and the second semiconductor region; and forming at the rear surface of the semiconductor substrate, a second electrode electrically connected to the first semiconductor layer, wherein forming the trench includes forming the trench to extend in a linear shape in a first direction parallel to the front surface of the semiconductor substrate, forming the first ion implantation mask includes: forming the first ion implantation mask to have the first opening extending in a linear shape in the first direction, the second opening interspersed at a predetermined interval in the first direction at positions separated from the first opening, and the third opening connecting the first opening and the second opening and interspersed at a predetermined interval in the first direction between the first opening and the second opening; and forming the first ion implantation mask to have sandwiched between the second openings that are adjacent to each other in the first direction, one or more portions connected to a portion between the third openings that are adjacent each other in the first direction, and forming the second ion implantation mask includes forming the second ion implantation mask to have the fourth opening extending in a linear shape in the first direction and exposing the fourth second-conductivity-type region and a portion of the second semiconductor layer between the fourth second-conductivity-type regions that are adjacent.

9. The silicon carbide semiconductor device according to claim 1, wherein a bottom surface of the first second-conductivity-type region and a bottom surface of the second second-conductivity-type region are provided at the same depth, and the one or more recessed portions are provided at positions shallower than the bottom surface of the first second-conductivity-type region and the bottom surface of the second second-conductivity-type region.

* * * * *